(12) United States Patent
Shinohara et al.

(10) Patent No.: US 12,036,662 B2
(45) Date of Patent: Jul. 16, 2024

(54) SUBSTRATE PROCESSING APPARATUS AND SUBSTRATE PROCESSING METHOD

(71) Applicant: SCREEN HOLDINGS CO., LTD., Kyoto (JP)

(72) Inventors: Tomoyuki Shinohara, Kyoto (JP); Yoshifumi Okada, Kyoto (JP); Nobuaki Okita, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 111 days.

(21) Appl. No.: 17/405,097

(22) Filed: Aug. 18, 2021

(65) Prior Publication Data
US 2022/0088793 A1    Mar. 24, 2022

(30) Foreign Application Priority Data

Sep. 18, 2020 (JP) ................. 2020-157269

(51) Int. Cl.
*H01L 21/67* (2006.01)
*B08B 1/12* (2024.01)
(Continued)

(52) U.S. Cl.
CPC .......... *B25J 11/0095* (2013.01); *B08B 1/12* (2024.01); *B08B 3/02* (2013.01); *B25J 9/1682* (2013.01);
(Continued)

(58) Field of Classification Search
None
See application file for complete search history.

(56) References Cited

U.S. PATENT DOCUMENTS

| 5,989,346 A | * 11/1999 | Hiroki ............... H01L 21/67778 414/935 |
| 8,166,985 B2 | 5/2012 | Nishiyama et al. .......... 134/137 |

(Continued)

FOREIGN PATENT DOCUMENTS

| JP | H08-139152 A | 5/1996 |
| JP | 2009-123800 A | 6/2009 |

(Continued)

OTHER PUBLICATIONS

Office Action dated Mar. 2, 2023 issued in the counterpart Taiwan Patent Application No. 110133306.

(Continued)

*Primary Examiner* — Michael S Lowe
(74) *Attorney, Agent, or Firm* — OSTROLENK FABER LLP

(57) ABSTRACT

A substrate processing apparatus includes a substrate processor and a substrate transporter. The substrate processor includes an upper holding device and a lower holding device configured to be capable of holding a substrate. In the substrate processor, the lower holding device is provided below the upper holding device. Therefore, a height position at which a substrate can be held by the upper holding device is different from a height position at which the substrate can be held by the lower holding device. The substrate transporter has first and second hands that hold a substrate. The second hand is located farther downwardly than the first hand. A substrate is received from or transferred to the upper holding device by the first hand. A substrate is received from or transferred to the lower holding device by the second hand.

20 Claims, 20 Drawing Sheets

(51) Int. Cl.
  *B08B 3/02*    (2006.01)
  *B25J 9/16*    (2006.01)
  *B25J 11/00*   (2006.01)
  *H01L 21/677*  (2006.01)

(52) U.S. Cl.
  CPC .. *H01L 21/67196* (2013.01); *H01L 21/67742* (2013.01); *H01L 21/67754* (2013.01)

(56) References Cited

U.S. PATENT DOCUMENTS

| | | | |
|---|---|---|---|
| 9,728,436 B2* | 8/2017 | Tabrizi | H01L 21/67754 |
| 9,921,570 B2* | 3/2018 | Hirato | H01L 21/67781 |
| 9,947,556 B2 | 4/2018 | Takiguchi et al. | |
| 2004/0013503 A1* | 1/2004 | Sandhu | H01L 21/67766 |
| | | | 414/416.08 |
| 2004/0231997 A1 | 11/2004 | Wang et al. | 205/143 |
| 2005/0061240 A1 | 3/2005 | Hashinoki et al. | 118/500 |
| 2008/0156351 A1 | 7/2008 | Mitsuyoshi et al. | 134/15 |
| 2008/0159832 A1* | 7/2008 | Mitsuyoshi | H01L 21/67781 |
| | | | 414/217 |
| 2014/0202499 A1 | 7/2014 | Mitsuyoshi et al. | 134/25.1 |
| 2014/0202501 A1 | 7/2014 | Mitsuyoshi et al. | 134/61 |
| 2015/0131088 A1 | 5/2015 | Shinohara et al. | |
| 2015/0268660 A1* | 9/2015 | Hirato | H01L 21/67745 |
| | | | 700/112 |
| 2016/0236239 A1 | 8/2016 | Nishiyama | |
| 2017/0056936 A1 | 3/2017 | Nishiyama | |
| 2017/0221696 A1 | 8/2017 | Nishiyama | |
| 2019/0214245 A1 | 7/2019 | Nishiyama | |
| 2021/0210338 A1 | 7/2021 | Nishiyama | |

FOREIGN PATENT DOCUMENTS

| | | |
|---|---|---|
| JP | 2010-045214 A | 2/2010 |
| JP | 4744426 B2 | 8/2011 |
| JP | 2014-078676 A | 5/2014 |
| JP | 5904169 B2 | 4/2016 |
| JP | 2016-152274 A | 8/2016 |
| JP | 5993625 B2 | 9/2016 |
| JP | 2017-139442 A | 8/2017 |
| JP | 2020-167438 A | 10/2020 |
| KR | 10-1998-0041650 A | 8/1998 |
| KR | 10-2015-0059745 A | 6/2015 |
| KR | 10-2016-0100839 A | 8/2016 |
| KR | 10-2017-0026198 A | 3/2017 |
| TW | 201830564 A | 8/2018 |

OTHER PUBLICATIONS

Notice of Allowance dated Mar. 18, 2024 issued in corresponding Korean Application No. 10-2021-0119987.

Office Action dated Apr. 16, 2024 issued in corresponding Japanese Application No. 2020-157269.

* cited by examiner

FIG. 3

PLAN VIEW

SIDE VIEW OF SUBSTRATE CLEANING
DEVICE TAKEN ALONG LINE A-A

SIDE VIEW OF SUBSTRATE CLEANING
DEVICE TAKEN ALONG LINE B-B

PLAN VIEW

SIDE VIEW OF SUBSTRATE CLEANING
DEVICE TAKEN ALONG LINE A-A

SIDE VIEW OF SUBSTRATE CLEANING
DEVICE TAKEN ALONG LINE B-B

PLAN VIEW

SIDE VIEW OF SUBSTRATE CLEANING
DEVICE TAKEN ALONG LINE A-A

SIDE VIEW OF SUBSTRATE CLEANING
DEVICE TAKEN ALONG LINE B-B

PLAN VIEW

SIDE VIEW OF SUBSTRATE CLEANING
DEVICE TAKEN ALONG LINE A-A

SIDE VIEW OF SUBSTRATE CLEANING
DEVICE TAKEN ALONG LINE B-B

PLAN VIEW

SIDE VIEW OF SUBSTRATE CLEANING DEVICE TAKEN ALONG LINE A-A

SIDE VIEW OF SUBSTRATE CLEANING DEVICE TAKEN ALONG LINE B-B

PLAN VIEW

SIDE VIEW OF SUBSTRATE CLEANING
DEVICE TAKEN ALONG LINE A-A

SIDE VIEW OF SUBSTRATE CLEANING
DEVICE TAKEN ALONG LINE B-B

PLAN VIEW

SIDE VIEW OF SUBSTRATE CLEANING
DEVICE TAKEN ALONG LINE A-A

SIDE VIEW OF SUBSTRATE CLEANING
DEVICE TAKEN ALONG LINE B-B

PLAN VIEW

SIDE VIEW OF SUBSTRATE CLEANING
DEVICE TAKEN ALONG LINE A-A

SIDE VIEW OF SUBSTRATE CLEANING
DEVICE TAKEN ALONG LINE B-B

PLAN VIEW

SIDE VIEW OF SUBSTRATE CLEANING
DEVICE TAKEN ALONG LINE A-A

SIDE VIEW OF SUBSTRATE CLEANING
DEVICE TAKEN ALONG LINE B-B

PLAN VIEW

SIDE VIEW OF SUBSTRATE CLEANING
DEVICE TAKEN ALONG LINE A-A

SIDE VIEW OF SUBSTRATE CLEANING
DEVICE TAKEN ALONG LINE B-B

PLAN VIEW

SIDE VIEW OF SUBSTRATE CLEANING DEVICE TAKEN ALONG LINE A-A

SIDE VIEW OF SUBSTRATE CLEANING DEVICE TAKEN ALONG LINE B-B

FIG. 19

| | SUBSTRATE PLATFORM PASS2 | SUBSTRATE CLEANING DEVICE 1A | SUBSTRATE CLEANING DEVICE 1B | SUBSTRATE PLATFORM PASS1 |
|---|---|---|---|---|
| HAND Ma | RECEPTION | TRANSFER | | |
| HAND Mb | RECEPTION | | TRANSFER | |
| HAND Mc | | RECEPTION | | TRANSFER |
| HAND Md | | | RECEPTION | TRANSFER |

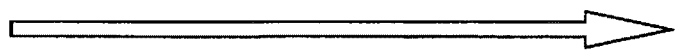
TIME

FIG. 20

| | SUBSTRATE PLATFORM PASS2 | SUBSTRATE CLEANING DEVICE 1A | SUBSTRATE CLEANING DEVICE 1B | SUBSTRATE PLATFORM PASS1 |
|---|---|---|---|---|
| HAND Ma | RECEPTION | TRANSFER | | |
| HAND Mb | | RECEPTION | | TRANSFER |
| HAND Mc | RECEPTION | | TRANSFER | |
| HAND Md | | | RECEPTION | TRANSFER |

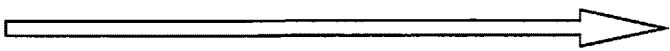
TIME

FIG. 21

|  | SUBSTRATE PLATFORM PASS2 | SUBSTRATE CLEANING DEVICE 1A | SUBSTRATE CLEANING DEVICE 1B | SUBSTRATE PLATFORM PASS1 |
|---|---|---|---|---|
| HAND Ma |  | RECEPTION |  | TRANSFER |
| HAND Mb |  |  | RECEPTION | TRANSFER |
| HAND Mc | RECEPTION | TRANSFER |  |  |
| HAND Md | RECEPTION |  | TRANSFER |  |

TIME

FIG. 22

|  | SUBSTRATE PLATFORM PASS2 | SUBSTRATE CLEANING DEVICE 1A | SUBSTRATE CLEANING DEVICE 1B | SUBSTRATE PLATFORM PASS1 |
|---|---|---|---|---|
| HAND Ma |  | RECEPTION |  | TRANSFER |
| HAND Mb | RECEPTION | TRANSFER |  |  |
| HAND Mc |  |  | RECEPTION | TRANSFER |
| HAND Md | RECEPTION |  | TRANSFER |  |

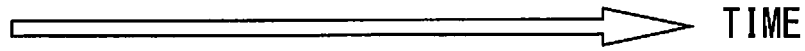
TIME

SUBSTRATE PROCESSING APPARATUS AND SUBSTRATE PROCESSING METHOD

BACKGROUND

Technical Field

The present invention relates to a substrate processing apparatus and a substrate processing method for performing a predetermined process on a substrate.

Description of Related Art

A substrate processing apparatus is used to perform various processes on various substrates such as a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate or a substrate for a solar cell. A substrate cleaning device is used to clean a substrate.

A substrate cleaning device described in JP 5904169 B2 includes two suction pads for holding a back-surface peripheral portion of a wafer, a spin chuck for holding a back-surface center portion of the wafer and a brush for cleaning a back surface of the wafer. The two suction pads hold the wafer and move in a transverse direction. In this state, the back-surface center portion of the wafer is cleaned by the brush. Thereafter, the spin chuck receives the wafer from the suction pads. Further, the spin chuck rotates while holding the back-surface center portion of the wafer. In this state, the back-surface peripheral portion of the wafer is cleaned by the brush.

In JP 5904169 B2, a coating-development device into which the above-mentioned substrate cleaning device is built is further described as a substrate processing apparatus. In the coating-development device, a plurality of processing blocks respectively including a resist film formation module, a development module, a substrate cleaning device and the like are provided. A wafer is transported by a transport mechanism among the plurality of processing blocks including the above-mentioned substrate cleaning device. In the substrate cleaning device, a wafer is received and transferred between support pins held at specific height positions and a transport mechanism.

SUMMARY

It is required to improve the throughput of a substrate processing apparatus in order to reduce the cost required for a substrate process.

An object of the present invention is to provide a substrate processing apparatus and a substrate processing method that enable improvement of throughput.

(1) A substrate processing apparatus according to one aspect of the present invention includes a first substrate processor that includes a first substrate holder configured to be capable of holding a first substrate at a first height position and a second substrate holder configured to be capable of holding a second substrate at a second height position lower than the first height position, a substrate transporter including a first transport holder configured to be capable of holding the first substrate and a second transport holder configured to be capable of holding the second substrate at a position farther downward than the first transport holder, and a transport controller that performs first control for controlling the substrate transporter, such that the first substrate is transferred to or received from the first substrate holder by the first transport holder and the second substrate is received from or transferred to the second substrate holder by the second transport holder.

In the substrate processing apparatus, the first transport holder performs the operation of transferring or receiving the first substrate with respect to the first substrate holder, and the second transport holder performs the operation of receiving or transferring the second substrate with respect to the second substrate holder. Thus, the first and second substrates are replaced with each other with respect to the first substrate processor. As a result, the throughput of the substrate processing apparatus can be improved.

(2) The substrate processing apparatus may further include a first substrate supporter configured to be capable of supporting the first substrate and supporting a third substrate below the first substrate, wherein the substrate transporter may further include a third transport holder configured to be capable of holding the third substrate at a position farther downward than the first transport holder, and the transport controller may perform second control for controlling the substrate transporter, such that the first substrate supported by the first substrate supporter is received by the first transport holder and the third substrate supported by the first substrate supporter is received by the third transport holder with the first substrate and the third substrate supported by the first substrate supporter, before the first control is performed.

In this case, before the first and second substrates are received and transferred between the first substrate processor and the substrate transporter, the first and third transport holders receive the first and third substrates from the first substrate supporter. Thus, the first substrate held by the first transport holder can be transported to the first substrate processor. Further, the third substrate held by the third transport holder can be transported to another substrate processor different from the first substrate processor.

(3) The substrate processing apparatus may further include a second substrate supporter configured to be capable of supporting the second substrate, wherein the transport controller may perform third control for controlling the substrate transporter such that the second substrate that has been received by the second transport holder is transferred to the second substrate supporter, after the first control is performed such that the second transport holder receives the second substrate.

In this case, the second substrate held at the second height position in the first substrate processor is transported to the second substrate supporter.

(4) The substrate processing apparatus may further include a second substrate processor including a third substrate holder configured to be capable of holding a third substrate at a third height position and a fourth substrate holder configured to be capable of holding a fourth substrate at a fourth height position lower than the third height position, wherein the substrate transporter may further include a third transport holder configured to be capable of holding the third substrate at a position farther downward than the first transport holder and a fourth transport holder configured to be capable of holding the fourth substrate at a position farther downward than the third transport holder, and the transport controller may perform fourth control for controlling the substrate transporter, such that the third substrate is transferred to or received from the third substrate holder by the third transport holder and the fourth substrate is received from or transferred to the fourth substrate holder by the fourth transport holder.

In this case, the third transport holder performs the operation of transferring or receiving the third substrate with respect to the third substrate holder, and the fourth transport holder performs the operation of receiving or transferring the fourth substrate with respect to the fourth substrate holder. Thus, the third and fourth substrates can be replaced with each other with respect to the second substrate processor. As a result, the throughput of the substrate processing apparatus can be improved.

(5) The substrate processing apparatus may further include a first substrate supporter configured to be capable of supporting the first substrate and supporting the third substrate below the first substrate, wherein the transport controller may perform fifth control for controlling the substrate transporter, such that the first substrate supported by the first substrate supporter is received by the first transport holder and the third substrate supported by the first substrate supporter is received by the third transport holder with the first substrate and the third substrate supported by the first substrate supporter, before the first control and the fourth control are performed.

In this case, before the first and second substrates are transferred and received between the first substrate processor and the substrate transporter, and before the third and fourth substrates are received and transferred between the second substrate processor and the substrate transporter, the first and third transport holders receive the first and third substrates from the first substrate supporter. Thus, the first substrate held by the first transport holder can be transported to the first substrate processor. Further, the third substrate held by the third transport holder can be transported to the second substrate processor.

(6) The substrate processing apparatus may further include a second substrate supporter configured to be capable of supporting the second substrate and configured to be capable of supporting the fourth substrate below the second substrate, wherein the transport controller may perform sixth control for controlling the substrate transporter such that the second substrate that has been received by the second transport holder is transferred to the second substrate supporter, after the first control is performed such that the second transport holder receives the second substrate, and may perform seventh control for controlling the substrate transporter such that the fourth substrate that has been received by the fourth transport holder is transferred to the second substrate supporter, after the fourth control is performed such that the fourth transport holder receives the fourth substrate.

In this case, the second substrate held at the second height position in the first substrate processor is transported to the second substrate supporter. Further, the fourth substrate held at the fourth height position in the second substrate processor is transported to the second substrate supporter. In this manner, because the second and fourth substrates are transported to the common second substrate supporter, as compared to individual transportation of the second and fourth substrates to two different substrate supporters, the period of time required for transportation of the second and fourth substrates is shortened.

(7) A distance between the first height position and the second height position may be equal to or substantially equal to a distance between a portion holding the first substrate of the first transport holder and a portion holding the second substrate of the second transport holder in an up-and-down direction. In this case, the throughput of the substrate processing apparatus can be further improved.

(8) The first substrate holder may be configured to be capable of holding the first substrate by abutting against a plurality of portions of an outer peripheral end of the first substrate, the second substrate holder may be configured to be capable of holding the second substrate by sucking a lower-surface center portion of the second substrate, and the first substrate processor may further include a cleaner configured to be capable of cleaning the lower-surface center portion of the first substrate held by the first substrate holder and configured to be capable of cleaning a lower-surface outer region surrounding the lower-surface center portion of the second substrate held by the second substrate holder.

In this case, in the first substrate processor, the lower-surface center portion of the first substrate held by the first substrate holder at the first height position is cleaned, and the lower-surface outer region of the second substrate held by suction by the second substrate holder at the second height position is cleaned. Thus, the entire lower surface of the substrate is cleaned.

(9) A substrate processing method includes performing a first operation of transferring a first substrate to or receiving the first substrate from a first substrate holder that is included in a first substrate processor and configured to be capable of holding the first substrate at a first height position, using a first transport holder that is included in a substrate transporter and configured to be capable of holding the first substrate, and performing a second operation of receiving a second substrate from or transferring the second substrate to a second substrate holder that is included in the first substrate processor and configured to be capable of holding the second substrate at a second height position lower than the first height position, using a second transport holder that is included in the substrate transporter and configured to be capable of holding the second substrate at a position farther downward than the first transport holder.

With the substrate processing method, the first transport holder performs the first operation of transferring or receiving the first substrate with respect to the first substrate holder, and the second transport holder performs the second operation of receiving or transferring the second substrate with respect to the second substrate holder. Thus, the first and second substrates are replaced with each other with respect to the first substrate processor. As a result, the throughput of the substrate processing apparatus can be improved.

(10) The substrate processing method may further include receiving the first substrate supported by the first substrate supporter using the first transport holder and receiving a third substrate supported by the first substrate supporter using a third transport holder configured to be capable of holding the third substrate at a position farther downward than the first transport holder with the first substrate and the third substrate supported by the first substrate supporter configured to be capable of supporting the first substrate and supporting the third substrate below the first substrate, before the first and second operations are performed.

In this case, before the first and second operations, the first and third transport holders receive the first and third substrates from the first substrate supporter. Thus, the first substrate held by the first transport holder can be transported to the first substrate processor. Further, the third substrate held by the third transport holder can be transported to another substrate processor different from the first substrate processor.

(11) The substrate processing method may further include transferring the second substrate that has been received by the second transport holder to a second substrate supporter configured to be capable of supporting the second substrate, after the first and second operations are performed such that the second transport holder receives the second substrate.

In this case, the second substrate held at the second height position in the first substrate processor is transported to the second substrate supporter.

(12) The substrate processing method may further include performing a third operation of transferring a third substrate to or receiving the third substrate from a third substrate holder that is included in a second substrate processor and configured to be capable of holding the third substrate at a third height position using a third transport holder that is included in the substrate transporter and configured to be capable of holding the third substrate at a position farther downward than the first transport holder, and performing a fourth operation of receiving a fourth substrate from or transferring the fourth substrate to a fourth substrate holder that is included in the second substrate processor and configured to be capable of holding the fourth substrate at a fourth height position lower than the third height position using a fourth transport holder that is included in the substrate transporter and configured to be capable of holding the fourth substrate at a position farther downward than the third transport holder.

In this case, the third transport holder performs the third operation of transferring or receiving the third substrate with respect to the third substrate holder, and the fourth transport holder performs the fourth operation of transferring or receiving the fourth substrate with respect to the fourth substrate holder. Thus, the third and fourth substrates can be replaced with each other with respect to the second substrate processor. As a result, the throughput of the substrate processing apparatus can be improved.

(13) The substrate processing method may further include receiving the first substrate supported by the first substrate supporter using the first transport holder and receiving the third substrate supported by the first substrate supporter using the third transport holder with the first substrate and the third substrate supported by a first substrate supporter configured to be capable of supporting the first substrate and supporting the third substrate below the first substrate, before the first to fourth operations are performed.

In this case, before the first to fourth operations, the first and third transport holders receive the first and third substrates from the first substrate supporter. Thus, the first substrate held by the first transport holder can be transported to the first substrate processor. Further, the third substrate held by the third transport holder can be transported to the second substrate processor.

(14) The substrate processing method may further include transferring the second substrate that has been received by the second transport holder to a second substrate supporter configured to be capable of supporting the second substrate and configured to be capable of supporting the fourth substrate below the second substrate, after the first and second operations are performed such that the second transport holder receives the second substrate, and transferring the fourth substrate that has been received by the fourth transport holder to the second substrate supporter, after the third and fourth operations are performed such the fourth transport holder receives the fourth substrate.

In this case, the second substrate held at the second height position in the first substrate processor is transported to the second substrate supporter. Further, the fourth substrate held at the fourth height position in the second substrate processor is transported to the second substrate supporter. In this manner, because the second and fourth substrates are transported to the common second substrate supporter, as compared to individual transportation of the second and fourth substrates to two different substrate supporters, the period of time required for transportation of the second and fourth substrates is shortened.

Other features, elements, characteristics, and advantages of the present disclosure will become more apparent from the following description of preferred embodiments of the present disclosure with reference to the attached drawings.

BRIEF DESCRIPTION OF THE DRAWING

FIG. 3 is a schematic plan view of a substrate cleaning device according to the one embodiment of the present invention;

FIG. 19 is a diagram showing one example of a specific operation pattern of the main robot in a processing block;

FIG. 20 is a diagram showing another example of the specific operation pattern of the main robot in the processing block;

FIG. 21 is a diagram showing one example of the operation pattern of the main robot according to another embodiment; and FIG. 22 is a diagram showing another example of the operation pattern of the main robot according to another embodiment.

DETAILED DESCRIPTION

A substrate processing apparatus and a substrate processing method according to embodiments of the present invention will be described below with reference to the drawings. In the following description, a substrate refers to a semiconductor substrate (wafer), a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a ceramic substrate, a substrate for a solar battery, or the like. Further, in the present embodiment, the upper surface of a substrate is a circuit forming surface (main surface), and the lower surface of the substrate is the surface opposite to the circuit forming surface (back surface). Further, in the present embodiment, a substrate is circular except for a notch.

[1] Configuration of Substrate Processing Apparatus

Figure 1:
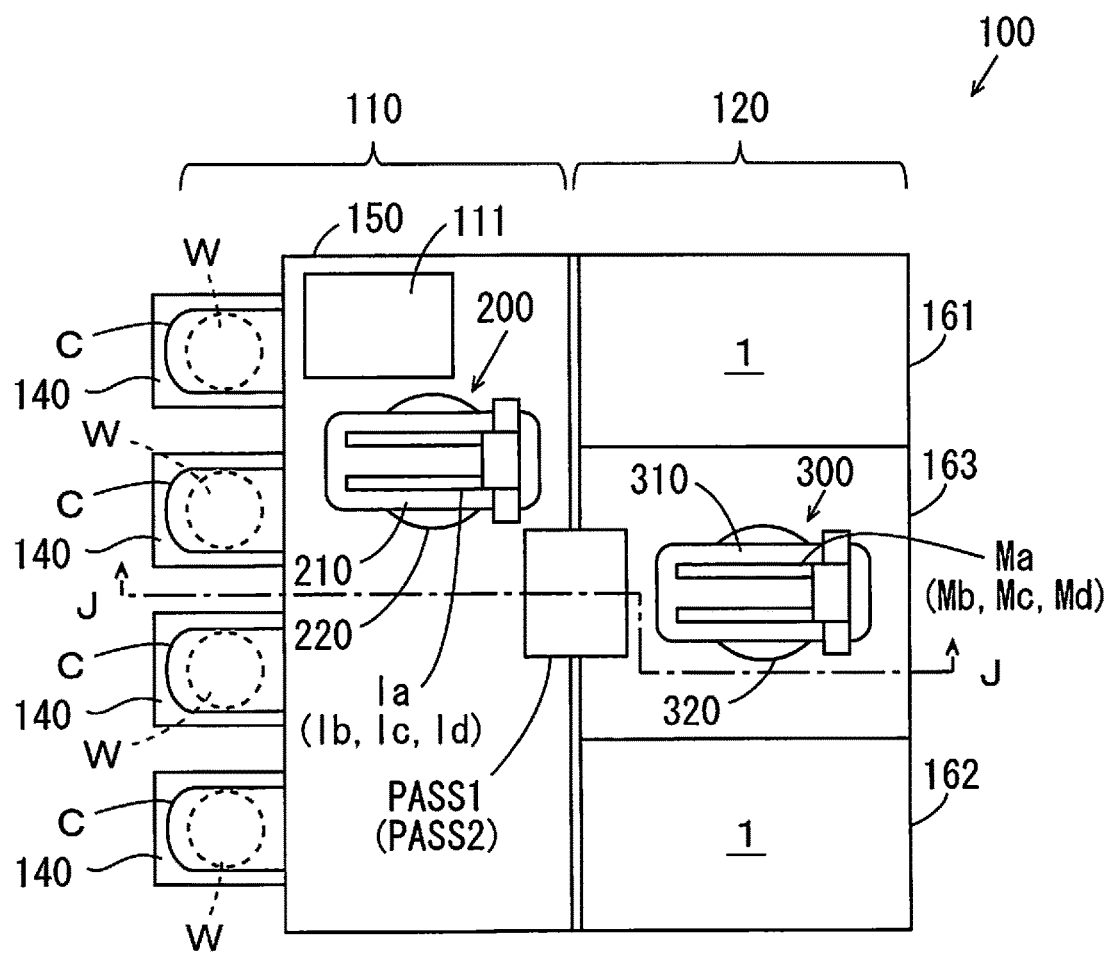
FIG. 1 is a schematic plan view of a substrate processing apparatus according to one embodiment.
Figure 2:
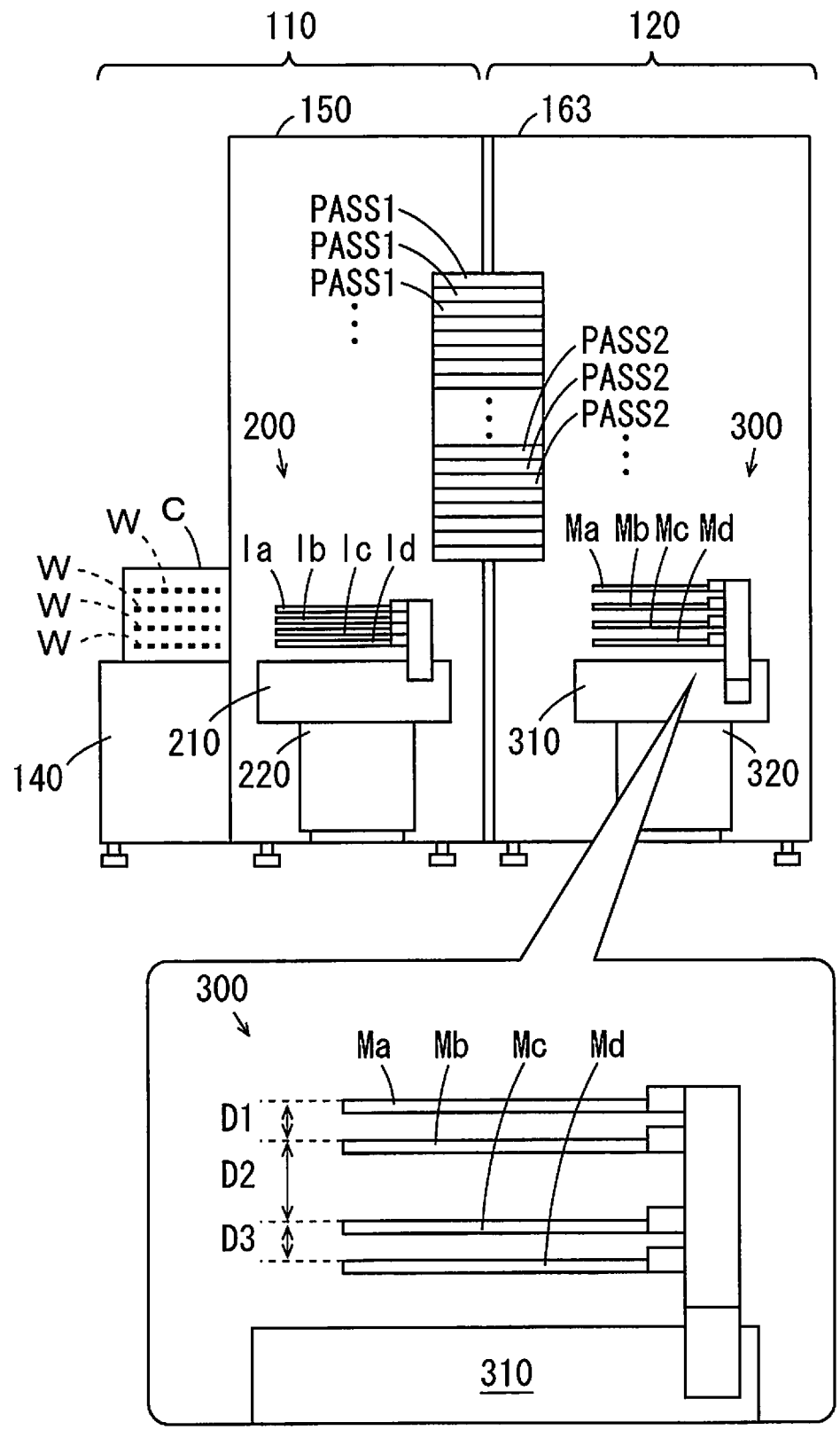
FIG. 2 is a schematic cross sectional view of the substrate processing apparatus taken along the line J-J of FIG. 1.

FIG. 1 is a schematic plan view of the substrate cleaning apparatus according to one embodiment of the present invention, and FIG. 2 is a schematic cross sectional view of the substrate processing apparatus 100 taken along the line J-J. As shown in FIG. 1, the substrate processing apparatus 100 according to the present embodiment has an indexer block 110 and a processing block 120. The indexer block 110 and the processing block 120 are provided to be adjacent to each other.

The indexer block 110 includes a plurality (four in the present example) of carrier platforms 140 and a transport section 150. The plurality of carrier platforms 140 are connected to the transport section 150 and arranged in a row and at intervals. On each carrier platform 140, a carrier C for storing a plurality of substrates W is placed.

In the transport section 150, an indexer robot 200 and a controller 111 are provided. The indexer robot 200 includes a plurality (four in the present example) of hands Ia, Ib, Ic, Id, a hand support member 210 and a transport driver 220.

The plurality of hands Ia to Id are configured to be capable of respectively holding a plurality of substrates W and are provided on the hand support member 210 to be arranged in an up-and-down direction and at constant intervals. The hand support member 210 is formed to extend in one direction. The plurality of hands Ia to Id are supported by the hand support member 210 to be advanceable and retreatable in one direction. The transport driver 220 is configured to be movable in a horizontal direction (the direction in which the plurality of carrier platforms 140 are arranged). The hand support member 210 is supported by the transport driver 220 to be rotatable about a vertical axis, liftable and lowerable. Further, the transport driver 220 includes a plurality of motors, an air cylinder and the like, and moves the hand support member 210 in the horizontal direction, rotates the hand support member 210 about the vertical axis, and lifts or lowers the hand support member 210 in order to transport a plurality of substrates W using the plurality of hands Ia to Id. Further, the transport driver 220 causes the plurality of hands Ia to Id to advance or retreat in the horizontal direction. A controller 111 is made of a computer or the like including a CPU (Central Processing Unit), a RAM (Random Access Memory), a ROM (Read Only Memory) and a storage device and controls each constituent element in the substrate processing apparatus 100.

The processing block 120 includes cleaning sections 161, 162 and a transport section 163. The cleaning section 161, the transport section 163 and the cleaning section 162 are adjacent to the transport section 150 and arranged in this order. In the cleaning sections 161, 162, a plurality (three, for example) of substrate cleaning devices 1 are arranged in a stack. Details of the configuration and operation of a substrate cleaning device 1 will be described below.

A main robot 300 is provided in the transport section 163. The main robot 300 includes a plurality (four in the present example) of hands Ma, Mb, Mc, Md, a hand support member 310 and a transport driver 320. The plurality of hands Ma to Md are configured to be capable of holding a plurality of substrates W and provided on the hand support member 310 to be arranged in the up-and-down direction.

In FIG. 2, an enlarged side view of the plurality of hands Ma to Md and their peripheral portions is shown in a balloon. As shown in the balloon, the plurality of hands Ma, Mb, Mc, Md are arranged in this order from above to below. In the following description, the distance between a height position at which a substrate W can be held by one hand and a height position at which a substrate W can be held by another hand is referred to as an inter-hand distance.

In the example of FIG. 2, the inter-hand distance D1 between the hands Ma, Mb is equal to the inter-hand distance D3 between the hands Mc, Md and is 10 mm, for example. On the other hand, the inter-hand distance D2 between the hands Mb, Mc is larger than the inter-hand distances D1, D3 and is 24 mm, for example. When the main robot 300 transports the substrate W, two pairs of hands that have equal inter-hand distances out of the four hands Ma to Md are defined. In each pair of hands, one hand is used to carry out a processed substrate W from one substrate cleaning device 1, and the other hand is used to carry an unprocessed substrate W into the one substrate cleaning device 1.

For example, in a case where one pair of hands is defined to be the hands Ma, Mb, the other pair of hands is defined to be the hands Mc, Md. In this case, the hands Ma, Mb respectively function as a first transport holder and a second transport holder of the present invention, and the hands Mc, Md respectively function as a third transport holder and a fourth transport holder of the present invention. On the other hand, in a case where one pair of hands is defined to be the hands Ma, Mc, the other pair of hands is defined to be the hands Mb, Md. In this case, the hands Ma, Mc respectively function as a first transport holder and a second transport holder of the present invention, and the hands Mb, Md respectively function as a third transport holder and a fourth transport holder of the present invention. The above-mentioned inter-hand distances D1, D2, D3 may be equal to one another.

The hand support member 310 is formed to extend in one direction. The plurality of hands Ma to Md are supported by the hand support member 310 to be individually advanceable and retreatable in the one direction. The hand support member 310 is supported by the transport driver 320 to be rotatable about a vertical axis, liftable and lowerable. Further, the transport driver 320 includes a plurality of motors, an air cylinder and the like, and rotates the hand support member 310 about the vertical axis, lifts or lowers the hand support member 310 in order to transport a plurality of substrates W using the plurality of hands Ma to Md. Further, the transport driver 320 causes the plurality of hands Ma to Md to advance or retreat in the horizontal direction.

A plurality (about twenty, for example) of substrate platforms PASS1, PASS2 for receiving and transferring substrates W between the indexer robot 200 and the main robot 300 are stacked between the indexer block 110 and the processing block 120. A plurality of substrate platforms PASS1 are located farther upwardly than a plurality of substrate platforms PASS2.

The plurality of substrate platforms PASS2 are used to transfer substrates W from the indexer robot 200 to the main robot 300. The plurality of substrate platforms PASS1 are used to transfer substrate W from the main robot 300 to the indexer robot 200.

In the substrate processing apparatus 100, the indexer robot 200 takes out an unprocessed substrate W from any one of the plurality of carriers C placed on the plurality of carrier platforms 140. Further, the indexer robot 200 places a taken and unprocessed substrate W to any one of the plurality of substrate platforms PASS2. Further, the indexer robot 200 receives a processed substrate W placed on any one of the plurality of substrate platforms PASS1 and stores the substrate W in an empty carrier C.

Further, the main robot 300 receives an unprocessed substrate W placed on any one of the plurality of substrate platforms PASS2. Next, the main robot 300 carries out a processed substrate W from a substrate cleaning device 1 in which the processed substrate W is stored from among the plurality of substrate cleaning devices 1 in the cleaning sections 161, 162. Further, the main robot 300 carries an unprocessed substrate W that has been received from a substrate platform PASS2 into a substrate cleaning device 1 from which a processed substrate W has been carried out. Further, the main robot 300 places a substrate W that has been carried out from a substrate cleaning device 1 on any one of the plurality of substrate platforms PASS1. Details of the operation of transporting a substrate W by the main robot 300 will be described below.

[2] Configuration of Substrate Cleaning Devices

Figure 3:
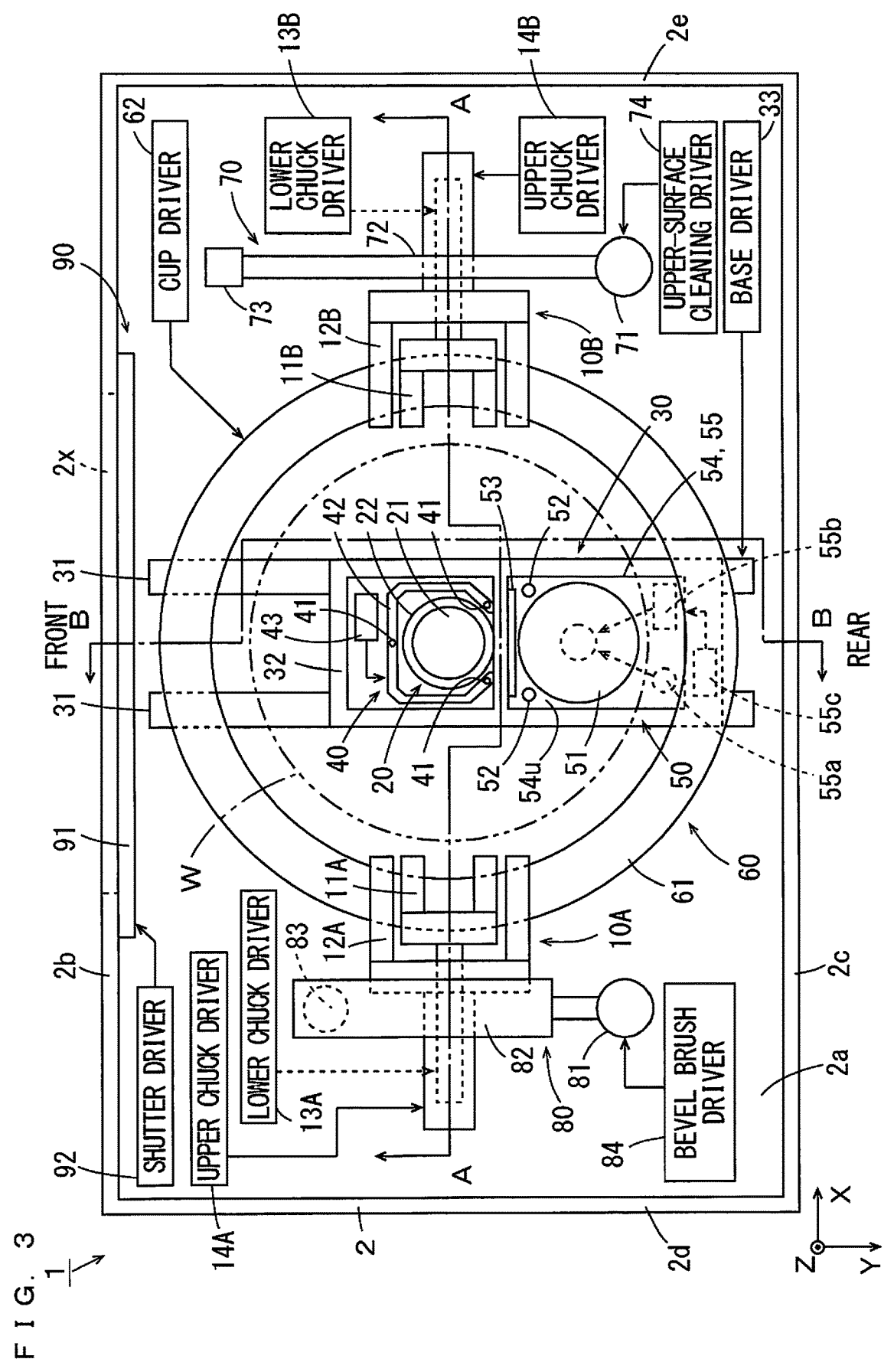
Figure 4:
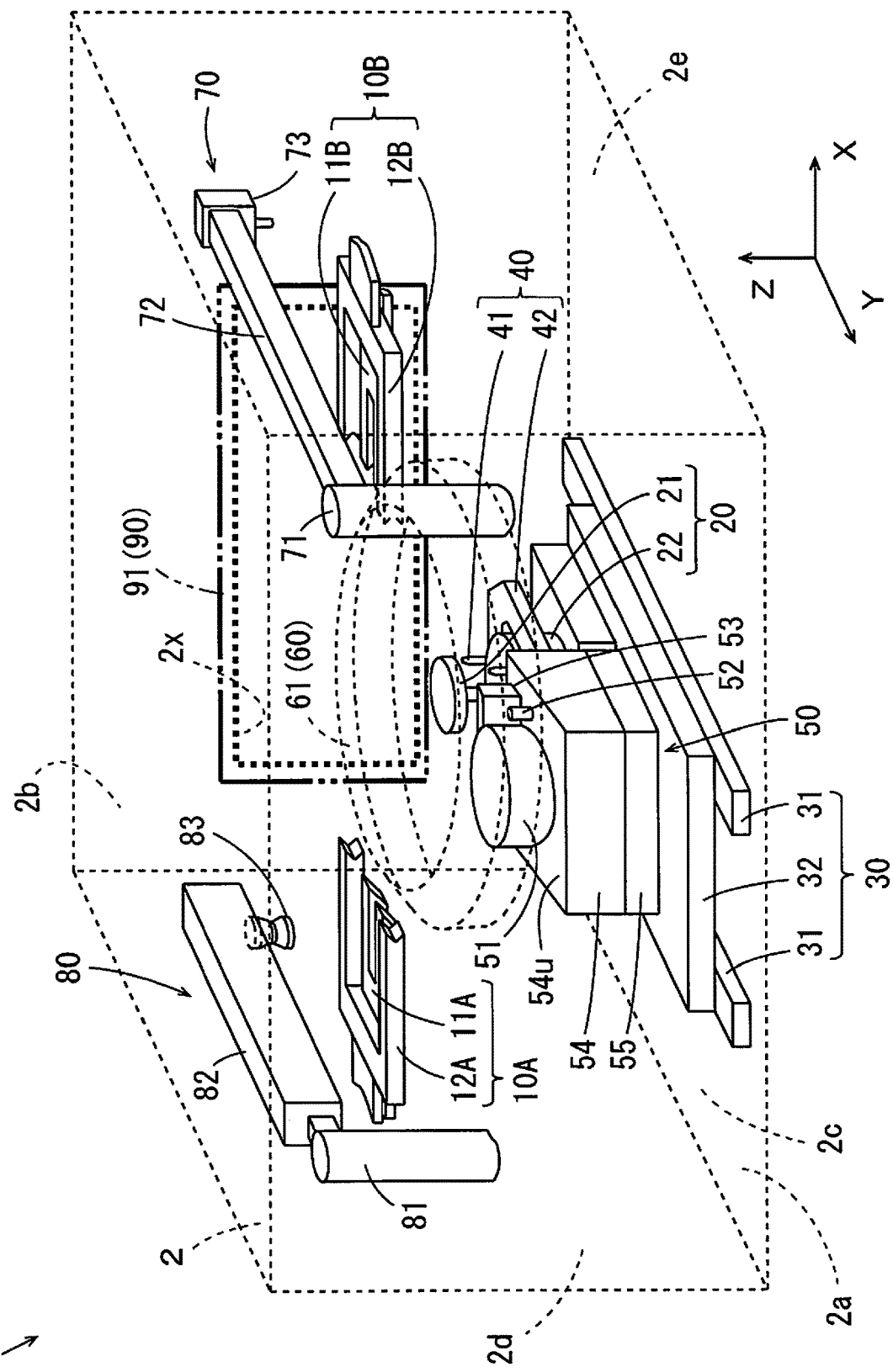
FIG. 4 is an external perspective view showing the inner configuration of the substrate cleaning device of FIG. 3.

FIG. 3 is a schematic plan view of a substrate cleaning device according to one embodiment of the present invention, and FIG. 4 is an external perspective view showing the inner configuration of the substrate cleaning device 1 of FIG. 3. In the substrate cleaning device 1 according to the present embodiment, X, Y and Z directions orthogonal to one another are defined for the clarity of a positional relationship. In FIG. 3 and the subsequent drawings, the X, Y and Z directions are suitably indicated by arrows. The X and Y directions are orthogonal to each other within a horizontal plane, and the Z direction corresponds to a vertical direction.

As shown in FIG. 3, the substrate cleaning device 1 includes upper holding devices 10A, 10B, a lower holding device 20, a base device 30, a receiving-transferring device 40, a lower-surface cleaning device 50, a cup device 60, an upper-surface cleaning device 70, an end-portion cleaning device 80 and an opening-closing device 90. These constituent elements are provided in a unit casing 2. In FIG. 4, the unit casing 2 is indicated by the dotted lines.

The unit casing 2 has a rectangular bottom surface portion 2a, and four sidewall portions 2b, 2c, 2d, 2e extending upwardly from four sides of the bottom surface portion 2a. The sidewall portions 2b, 2c are opposite to each other, and the sidewall portions 2d, 2e are opposite to each other. A rectangular opening is formed in the center portion of the sidewall portion 2b. The opening is an inlet-outlet port 2x for a substrate W and is used when a substrate W is carried into and carried out from the unit casing 2. In FIG. 4, the inlet-outlet port 2x is indicated by the thick dotted lines. In the following description, a direction directed outwardly of the unit casing 2 in the Y direction from the inside of the unit casing 2 through the inlet-outlet port 2x (the direction directed from the sidewall portion 2c toward the sidewall portion 2b) is referred to as forward, and its opposite direction (the direction directed from the sidewall portion 2b toward the sidewall portion 2c) is referred to as rearward.

An opening-closing device 90 is provided in a portion in which the inlet-outlet port 2x is formed and its vicinal region in the sidewall portion 2b. The opening-closing device 90 includes a shutter 91 that is configured to be capable of opening and closing the inlet-outlet port 2x and a shutter driver 92 that drives the shutter 91. In FIG. 4, the shutter 91 is indicated by the thick two-dots and dash lines. The shutter driver 92 drives the shutter 91 to open the inlet-outlet port 2x when a substrate W is carried into and carried out from the substrate cleaning device 1. Further, the shutter driver 92 drives the shutter 91 to close the inlet-outlet port 2x when a cleaning process is performed on a substrate W in the substrate cleaning device 1.

The base device 30 is provided in the center portion of the bottom surface portion 2a. The base device 30 includes linear guides 31, a mobile base 32 and a base driver 33. The linear guides 31 include two rails and are provided to extend in the Y direction from positions in the vicinity of the sidewall portion 2b to positions in the vicinity of the sidewall portion 2c in a plan view. The mobile base 32 is provided to be movable in the Y direction on the two rails of the linear guides 31. The base driver 33 includes a pulse motor, for example, and moves the mobile base 32 in the Y direction on the linear guides 31.

The lower holding device 20 and the lower-surface cleaning device 50 are provided on the mobile base 32 to be arranged in the Y direction. The lower holding device 20 includes a suction holder 21 and a suction holding driver 22. The suction holder 21 is a so-called spin chuck, has a circular suction surface that can hold a lower surface of a substrate W by suction and is configured to be rotatable about an axis extending in the up-and-down direction (the axis extending in the Z direction). In FIG. 3, the outer shape of a substrate W that is held by suction by the lower holding device 20 is indicated by the two-dots and dash line. In the following description, a region, that is to be sucked by the suction surface of the suction holder 21, in the lower surface of a substrate W when the substrate W is held by suction by the suction holder 21 is referred to as a lower-surface center portion. On the other hand, a region, surrounding the lower-surface center portion, in the lower surface of a substrate W is referred to as a lower-surface outer region.

The suction holding driver 22 includes a motor. The motor of the suction holding driver 22 is provided on the mobile base 32 such that its rotation shaft projects upwardly. The suction holder 21 is provided at the upper end portion of the rotation shaft of the suction holding driver 22. Further, in the rotation shaft of the suction holding driver 22, a suction path for holding a substrate W by suction in the suction holder 21 is formed. The suction path is connected to a suction device (not shown). The suction holding driver 22 rotates the suction holder 21 about the above-mentioned rotation shaft.

On the mobile base 32, the receiving-transferring device 40 is further provided in the vicinity of the lower holding device 20. The receiving-transferring device 40 includes a plurality (three in the present example) of support pins 41, a pin coupling member 42 and a pin lifting-lowering driver 43. The pin coupling member 42 is formed to surround the suction holder 21 in a plan view and couples the plurality of support pins 41 to one another. The plurality of support pins 41 extend upwardly by a certain length from the pin coupling member 42 while being coupled to one another by the pin coupling member 42. The pin lifting-lowering driver 43 lifts or lowers the pin coupling member 42 on the mobile base 32. Thus, the plurality of support pins 41 are lifted or lowered relative to the suction holder 21.

The lower-surface cleaning device 50 includes a lower-surface brush 51, two liquid nozzles 52, a gas injector 53, a lifting-lowering supporter 54, a movement supporter 55, a lower-surface brush rotation driver 55a, a lower-surface brush lifting-lowering driver 55b and a lower-surface brush movement driver 55c. The movement supporter 55 is provided to be movable in the Y direction with respect to the lower holding device 20 in a certain region on the mobile base 32. As shown in FIG. 4, the lifting-lowering supporter 54 is provided on the movement supporter 55 to be liftable and lowerable. The lifting-lowering supporter 54 has an upper surface 54u that is inclined downwardly in a direction away from the suction holder 21 (rearwardly in the present example).

As shown in FIG. 3, the lower-surface brush 51 is formed of a PVA (polyvinyl alcohol) sponge or a PVA sponge in which abrasive grains are dispersed, for example, and has a circular cleaning surface that can come into contact with the lower surface of the substrate W. Further, the lower-surface brush 51 is attached to the upper surface 54u of the lifting-lowering supporter 54 such that the cleaning surface is directed upwardly and the cleaning surface is rotatable about an axis extending in the up-and-down direction through the center of the cleaning surface. The area of the cleaning surface of the lower-surface brush 51 is larger than the area of the suction surface of the suction holder 21.

Each of the two liquid nozzles 52 is attached to the upper surface 54u of the lifting-lowering supporter 54 to be located in the vicinity of the lower-surface brush 51. Further, each of the two liquid nozzles 52 is attached to the upper surface 54u such that a liquid discharge port is directed upwardly. A lower-surface cleaning liquid supplier 56 (FIG. 5) is connected to the liquid nozzles 52. The lower-surface cleaning liquid supplier 56 supplies a cleaning liquid to the liquid nozzles 52. When a substrate W is cleaned by the lower-surface brush 51, the liquid nozzles 52 supply the cleaning liquid supplied from the lower-surface cleaning liquid supplier 56 to the lower surface of the substrate W. In the present embodiment, pure water (deionized water) is used as the cleaning liquid to be supplied to the liquid nozzles 52. As the cleaning liquid to be supplied to the liquid nozzles 52, carbonated water, ozone water, hydrogen water, electrolytic ionized water, SC1 (a mixed solution of ammonia and a hydrogen peroxide solution), TMAH (tetramethylammonium hydroxide) or the like can be used instead of pure water.

The gas injector 53 is a slit-like gas injection nozzle having a gas injection port extending in one direction. The gas injector 53 is attached to the upper surface 54u of the lifting-lowering supporter 54 to be located between the lower-surface brush 51 and the suction holder 21 in a plan view. Further, the gas injector 53 is attached to the upper surface 54u of the lifting-lowering supporter 54 such that a gas injection port is directed upwardly. An injection gas supplier 57 (FIG. 5) is connected to the gas injector 53. The injection gas supplier 57 supplies gas to the gas injector 53. In the present embodiment, a nitrogen gas is used as the gas to be supplied to the gas injector 53. The gas injector 53 injects the gas supplied from the injection gas supplier 57 to the lower surface of a substrate W when the substrate W is cleaned by the lower-surface brush 51 and when the lower surface of a substrate W is dried, as described below. In this case, a strip-shaped gas curtain extending in the X direction is formed between the lower-surface brush 51 and the suction holder 21. As the gas to be supplied to the gas injector 53, an inert gas such as an argon gas or a helium gas can be used instead of a nitrogen gas.

The lower-surface brush rotation driver 55a includes a motor, and rotates the lower-surface brush 51 when a substrate W is cleaned by the lower-surface brush 51. The lower-surface brush lifting-lowering driver 55b includes a stepping motor or an air cylinder, and lifts or lowers the lifting-lowering supporter 54 with respect to the movement supporter 55. The lower-surface brush movement driver 55c includes a motor, and moves the movement supporter 55 in the Y direction on the mobile base 32. Here, the position of the lower holding device 20 in the mobile base 32 is fixed. Therefore, when being moved by the lower-surface brush movement driver 55c in the Y direction, the movement supporter 55 is moved relative to the lower holding device 20. In the following description, the position of the lower-surface cleaning device 50 being located closest to the lower holding device 20 on the mobile base 32 is referred to as a proximal position, and the position of the lower-surface cleaning device 50 located farthest from the lower holding device 20 on the mobile base 32 is referred to as a distal position.

The cup device 60 is further provided in the center portion of the bottom surface portion 2a. The cup device 60 includes a processing cup 61 and a cup driver 62. The processing cup 61 is provided to surround the lower holding device 20 and the base device 30 in a plan view, and be liftable and lowerable. In FIG. 4, the processing cup 61 is indicated by the dotted lines. The cup driver 62 moves the processing cup 61 between a lower cup position and an upper cup position in accordance with which portion of the lower surface of a substrate W is to be cleaned by the lower-surface brush 51. The lower cup position is a height position at which the upper end portion of the processing cup 61 is located farther downwardly than a substrate W held by suction by the suction holder 21. Further, the upper cup position is a height position at which the upper end portion of the processing cup 61 is located farther upwardly than the suction holder 21.

At height positions farther upward than the processing cup 61, the pair of upper holding devices 10A, 10B is provided to be opposite to each other with the base device 30 held therebetween in a plan view. The upper holding device 10A includes a lower chuck 11A, an upper chuck 12A, a lower chuck driver 13A and an upper chuck driver 14A. The upper holding device 10B includes a lower chuck 11B, an upper chuck 12B, a lower chuck driver 13B and an upper chuck driver 14B.

The lower chucks 11A, 11B are arranged symmetrically with respect to a vertical plane extending in the Y direction (the front-and-rear direction) through the center of the suction holder 21 in a plan view, and are provided to be movable in the X direction in a common horizontal plane. Each of the lower chucks 11A, 11B has two support pieces that can be support a lower-surface peripheral portion of a substrate W from below the substrate W. The lower chuck drivers 13A, 13B move the lower chucks 11A, 11B such that the lower chucks 11A, 11B are closer to each other or are farther away from each other.

Similarly to the lower chucks 11A, 11B, the upper chucks 12A, 12B are arranged symmetrically with respect to the vertical plane extending in the Y direction (the front-and-rear direction) through the center of the suction holder 21 in a plan view, and are provided to be movable in the X direction in a common horizontal plane. Each of the upper chucks 12A, 12B has two holding pieces that are configured to abut against two portions of the outer peripheral end of a substrate W and be capable of holding the outer peripheral end of the substrate W. The upper chuck drivers 14A, 14B move the upper chucks 12A, 12B such that the upper chucks 12A, 12B are closer to each other or farther away from each other.

As shown in FIG. 3, at a position near one side of the processing cup 61, the upper-surface cleaning device 70 is provided to be located in the vicinity of the upper holding device 10B in a plan view. The upper-surface cleaning device 70 includes a rotation support shaft 71, an arm 72, a spray nozzle 73 and an upper-surface cleaning driver 74.

The rotation support shaft 71 is supported on the bottom surface portion 2a by the upper-surface cleaning driver 74 to extend in the up-and-down direction, and to be liftable, lowerable and rotatable. As shown in FIG. 4, at a position farther upward than the upper holding device 10A, the arm 72 is provided to extend in the horizontal direction from the upper end portion of the rotation support shaft 71. The spray nozzle 73 is attached to the tip portion of the arm 72.

An upper-surface cleaning fluid supplier 75 (FIG. 5) is connected to the spray nozzle 73. The upper-surface cleaning fluid supplier 75 supplies the cleaning liquid and gas to the spray nozzle 73. In the present embodiment, pure water is used as the cleaning liquid to be supplied to the spray nozzle 73, and a nitrogen gas is used as the gas to be supplied to the spray nozzle 73. When the upper surface of the substrate W is cleaned, the spray nozzle 73 mixes the cleaning liquid and the gas supplied from the upper-surface cleaning fluid supplier 75 to produce a fluid mixture, and injects the produced fluid mixture downwardly.

As the cleaning liquid to be supplied to the spray nozzle 73, carbonated water, ozone water, hydrogen water, electrolytic ionized water, SC1 (a mixed solution of ammonia and a hydrogen peroxide solution), TMAH (tetramethylammonium hydroxide) or the like can be used instead of pure water. Further, as the gas to be supplied to the spray nozzle 73, an inert gas such as an argon gas or a helium gas can be used instead of a nitrogen gas.

The upper-surface cleaning driver 74 includes one or a plurality of pulse motors, an air cylinder and the like, lifts or lowers the rotation support shaft 71, and rotates the rotation support shaft 71. With the above-mentioned configuration, on the upper surface of a substrate W held by suction and rotated by the suction holder 21, the spray nozzle 73 is moved in a circular arc shape. Thus, the entire upper surface of the substrate W can be cleaned.

As shown in FIG. 3, at a position near the other side of the processing cup 61, the end-portion cleaning device 80 is provided to be located in the vicinity of the upper holding device 10A in a plan view. The end-portion cleaning device 80 includes a rotation support shaft 81, an arm 82, a bevel brush 83 and a bevel brush driver 84.

The rotation support shaft 81 is supported on the bottom surface portion 2a by the bevel brush driver 84 to extend in the up-and-down direction and to be liftable, lowerable and rotatable. As shown in FIG. 4, at a position farther upward than the upper holding device 10A, the arm 82 is provided to extend in the horizontal direction from the upper end portion of the rotation support shaft 81. At the tip portion of the arm 82, the bevel brush 83 is provided to project downwardly and to be rotatable about an axis extending in the up-and-down direction.

The bevel brush 83 is formed of a PVA sponge or a PVA sponge in which abrasive grains are dispersed, for example, and its upper half portion has an inverse trapezoidal shape, and its lower half portion has a trapezoidal shape. With the bevel brush 83, the outer peripheral end of the substrate W can be cleaned with the center portion in the up-and-down direction of the outer peripheral surface.

The bevel brush driver 84 includes one or a plurality of pulse motors, an air cylinder and the like, lifts or lowers the rotation support shaft 81 and rotates the rotation support shaft 81. With the above-mentioned configuration, the center portion of the outer peripheral surface of the bevel brush 83 is brought into contact with the outer peripheral end of a substrate W held by suction and rotated by the suction holder 21. Thus, the entire outer peripheral end of the substrate W can be cleaned.

Here, the bevel brush driver 84 further includes a motor built in the arm 82. The motor rotates the bevel brush 83 provided at the tip portion of the arm 82 about the axis extending in the up-and-down direction. Therefore, when the outer peripheral end of a substrate W is cleaned, a cleaning force of the bevel brush 83 in the outer peripheral end of the substrate W is improved by rotation of the bevel brush 83.

[3] Control System of Substrate Processing Apparatus 100

Figure 5:
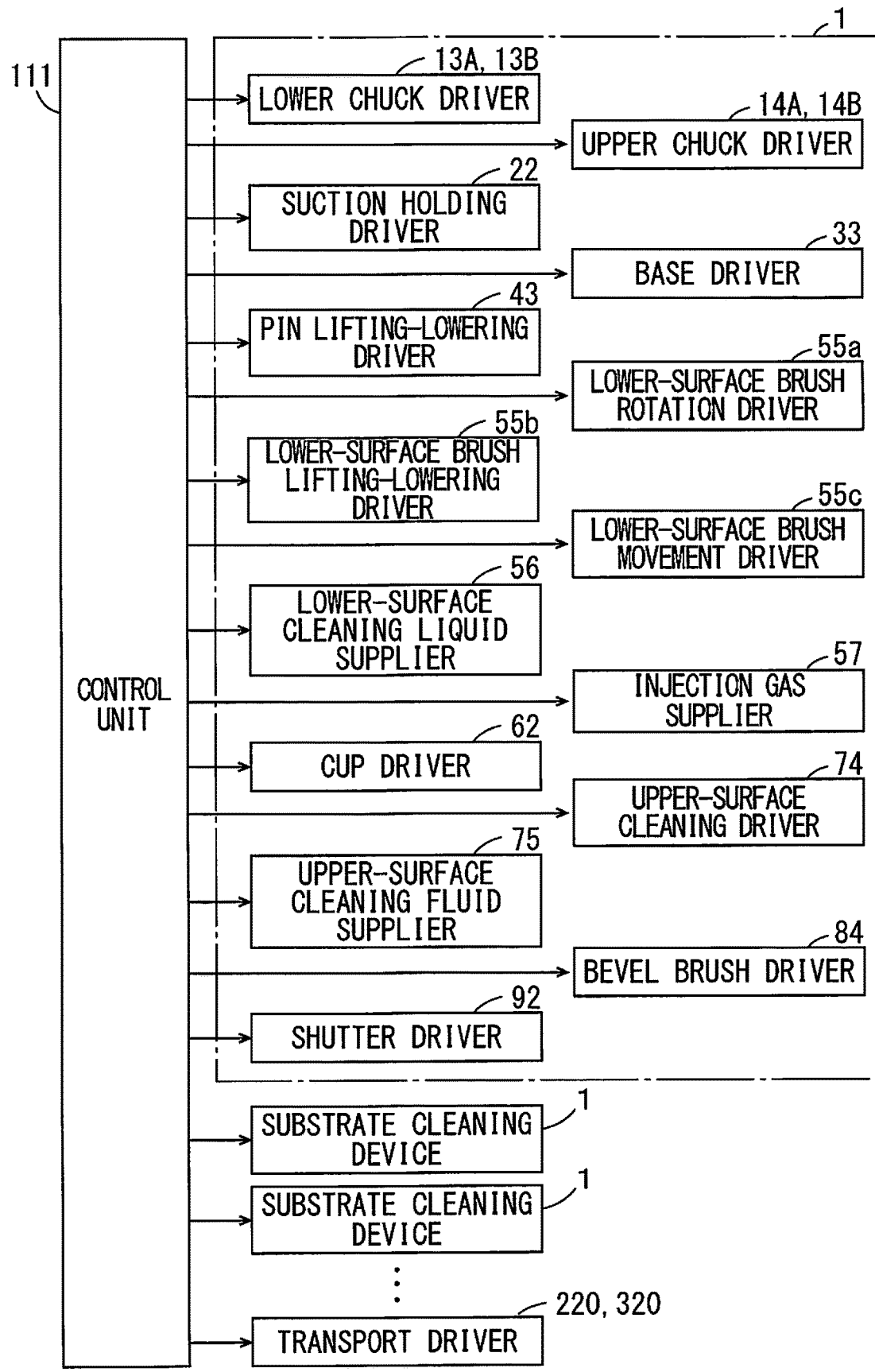
FIG. 5 is a block diagram showing the configuration of a control system of the substrate cleaning device according to the one embodiment of the present invention.

FIG. 5 is a block diagram showing the configuration of a control system of the substrate processing apparatus 100 according to one embodiment of the present invention. As described above, the controller 111 of FIG. 1 includes the CPU, the RAM, the ROM and the storage device. The RAM is used as a work area for the CPU. The ROM stores a system program. The storage device stores a control program. The operation of each component in the substrate processing apparatus 100 is controlled by execution of a substrate processing program stored in the storage device on the RAM by the CPU.

As shown in FIG. 5, the controller 111 controls the plurality of substrate cleaning devices 1 included in the substrate processing apparatus 100. At this time, in regard to each substrate cleaning device 1, the controller 111 mainly controls the lower chuck drivers 13A, 13B and the upper chuck drivers 14A, 14B in order to receive a substrate W that is carried into the substrate cleaning device 1 and hold the substrate W at a position above the suction holder 21. Further, the controller 111 mainly controls the suction holding driver 22 in order to hold a substrate W by suction by the suction holder 21 and rotate the substrate W held by suction.

Further, the controller 111 mainly controls the base driver 33 in order to move the mobile base 32 with respect to a substrate W held by the upper holding devices 10A, 10B. Further, the controller 111 controls the pin lifting-lowering driver 43 in order to move a substrate W between a height position of the substrate W held by the upper holding devices 10A, 10B and a height position of the substrate W held by the suction holder 21.

Further, the controller 111 controls the lower-surface brush rotation driver 55a, the lower-surface brush lifting-lowering driver 55b, the lower-surface brush movement driver 55c, the lower-surface cleaning liquid supplier 56 and the injection gas supplier 57 in order to clean the lower surface of a substrate W. Further, the controller 111 controls the cup driver 62 in order to receive the cleaning liquid splashed from a substrate W using the processing cup 61 when the substrate W held by the suction by the suction holder 21 is cleaned.

Further, the controller 111 controls the upper-surface cleaning driver 74 and the upper-surface cleaning fluid supplier 75 in order to clean the upper surface of a substrate W held by suction by the suction holder 21. Further, the controller 111 controls the bevel brush driver 84 in order to clean the outer peripheral end of a substrate W held by suction by the suction holder 21. Further, the controller 111 controls the shutter driver 92 in order to open and close the inlet-outlet port 2x of the unit casing 2 when a substrate W is carried into and carried out from a substrate cleaning device 1.

Further, the controller 111 controls the transport drivers 220, 320 in order to transport a substrate W between the plurality of carriers C and the plurality of substrate platforms PASS1, PASS2 and transport a substrate W between the plurality of substrate platforms PASS1, PASS2 and the plurality of substrate cleaning devices 1.

While the controller 111 controls the operations of the plurality of substrate cleaning devices 1 in addition to the operations of the indexer robot 200 and the main robot 300 in the example of FIG. 5, the present invention is not limited to this. A controller may be provided for each substrate cleaning device 1, and the operation of each of the plurality of substrate cleaning devices 1 may be controlled by the controller provided in each substrate cleaning device 1.

[4] Operation of Substrate Cleaning Devices 1

FIGS. 6 to 17 are schematic diagrams for explaining one example of the operation of the substrate cleaning device 1 of FIG. 3. In each of FIGS. 6 to 17, a plan view of the substrate cleaning device 1 is shown in the upper field. Further, a side view of the lower holding device 20 and its peripheral portions as viewed in the Y direction is shown in the middle field, and a side view of the lower holding device 20 and its peripheral portions as viewed in the X direction is shown in the bottom field. The side view in the middle field corresponds to the side view of the substrate cleaning device 1 taken along the line A-A of FIG. 3, and the side view in the bottom field corresponds to the side view of the substrate cleaning device 1 taken along the line B-B of FIG. 3. The expansion and contraction rates of part of the constituent elements are different for the plan view in the upper field and the side views in the middle and bottom fields in order to facilitate understanding of the shape and operation state of each constituent element in the substrate cleaning device 1. Further, in each of FIGS. 6 to 17, the processing cup 61 is indicated by the two-dots and dash lines, and the outer shape of a substrate W is indicated by the thick one-dot and dash line.

In an initial state before a substrate W is carried into the substrate cleaning device 1, the inlet-outlet port 2x is closed by the shutter 91 of the opening-closing device 90. Further, as shown in FIG. 3, the lower chucks 11A, 11B are maintained in a state where the distance between the lower chucks 11A, 11B is sufficiently larger than the diameter of the substrate W. Further, the upper chucks 12A, 12B are also maintained in a state where the distance between the upper chucks 12A, 12B is sufficiently larger than the diameter of the substrate W. Further, the mobile base 32 of the base device 30 is arranged such that the center of the suction holder 21 is located at the center of the processing cup 61 in a plan view. Further, the lower-surface cleaning device 50 is arranged in the proximal position on the mobile base 32. Further, the lifting-lowering supporter 54 of the lower-surface cleaning device 50 is in a state where the cleaning surface (the upper end portion) of the lower-surface brush 51 is located farther downwardly than the suction holder 21. Further, the receiving-transferring device 40 is in a state where the plurality of support pins 41 are located farther downwardly than the suction holder 21. Further, in the cup device 60, the processing cup 61 is in the lower cup position. In the following description, the center position of the processing cup 61 in a plan view is referred to as a plane reference position rp. Further, the position of the mobile base 32 located on the bottom surface portion 2a when the center of the suction holder 21 is in the plane reference position rp in a plan view is referred to as a first horizontal position.

Figure 6:
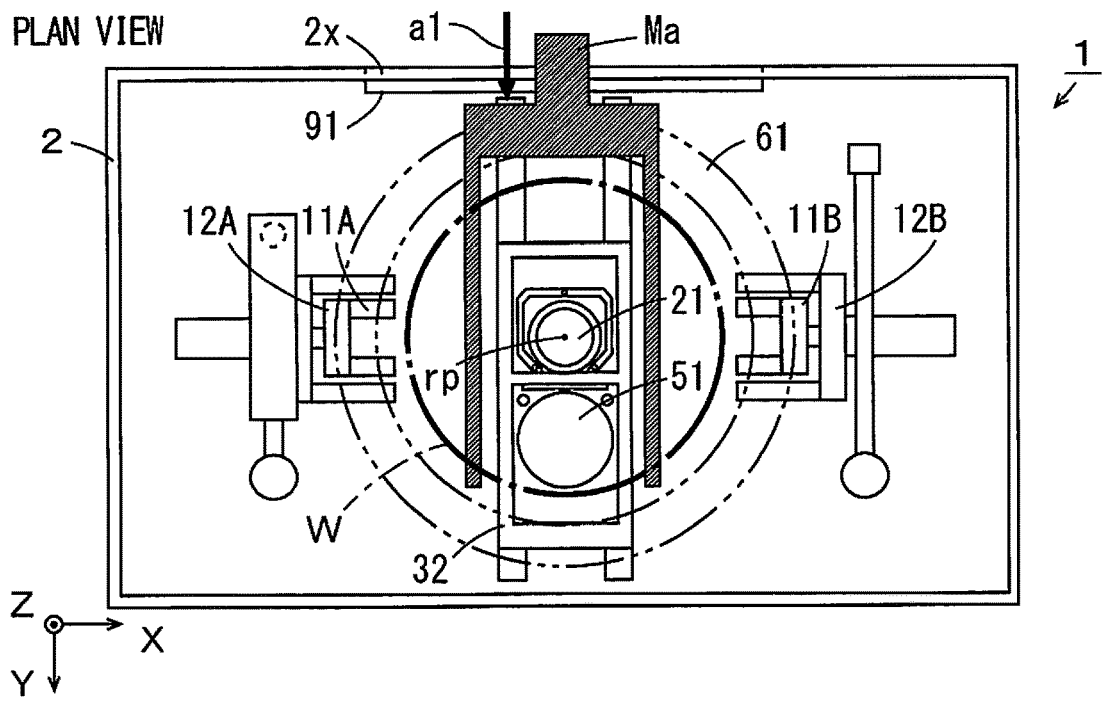
FIG. 6 is a schematic diagram for explaining one example of the operation of the substrate cleaning device of FIG. 3.
Figure 6:
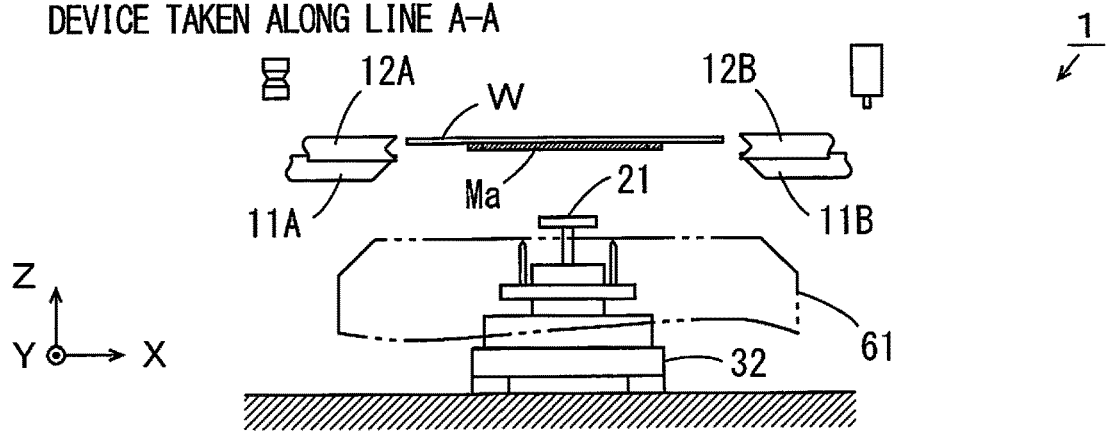
Figure 6:
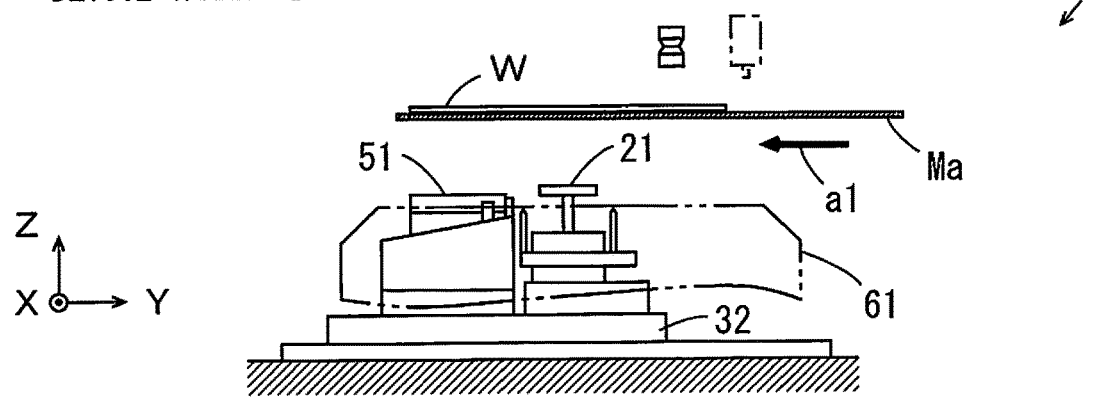

A substrate W is carried into the unit casing 2 of the substrate cleaning device 1. Specifically, the shutter 91 opens the inlet-outlet port 2x immediately before the substrate W is carried in. Thereafter, as indicated by the thick solid arrow a1 in FIG. 6, the hand Ma of the main robot 300 of FIG. 1 carries the substrate W to the substantially center position in the unit casing 2 through the inlet-outlet port 2x. At this time, the substrate W held by the hand Ma is located between the lower chuck 11A and the upper chuck 12A, and the lower chuck 11B and the upper chuck 12B as shown in FIG. 6.

Figure 7:
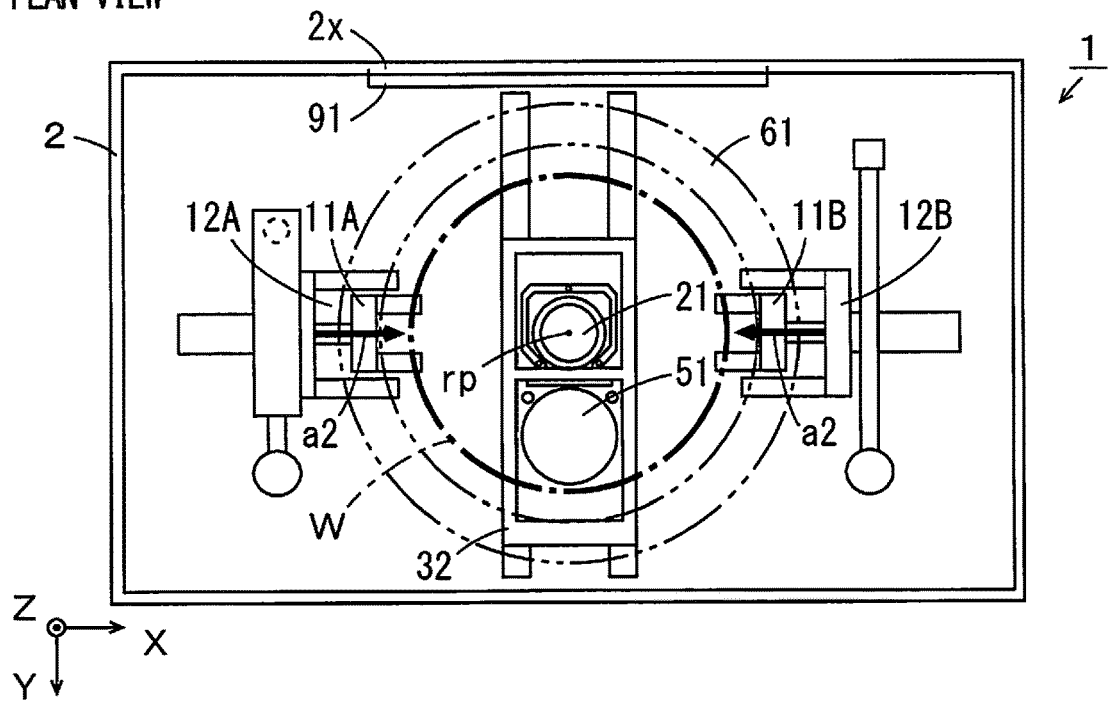
FIG. 7 is a schematic diagram for explaining one example of the operation of the substrate cleaning device of FIG. 3.
Figure 7:
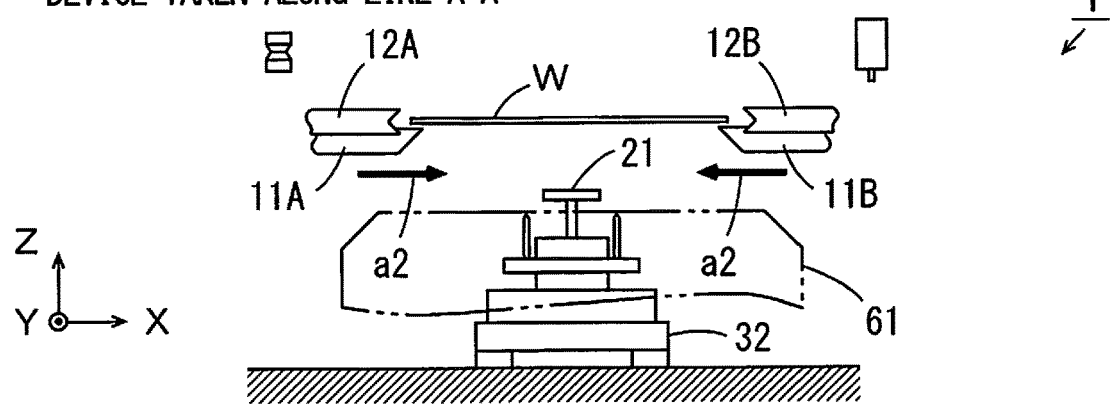
Figure 7:
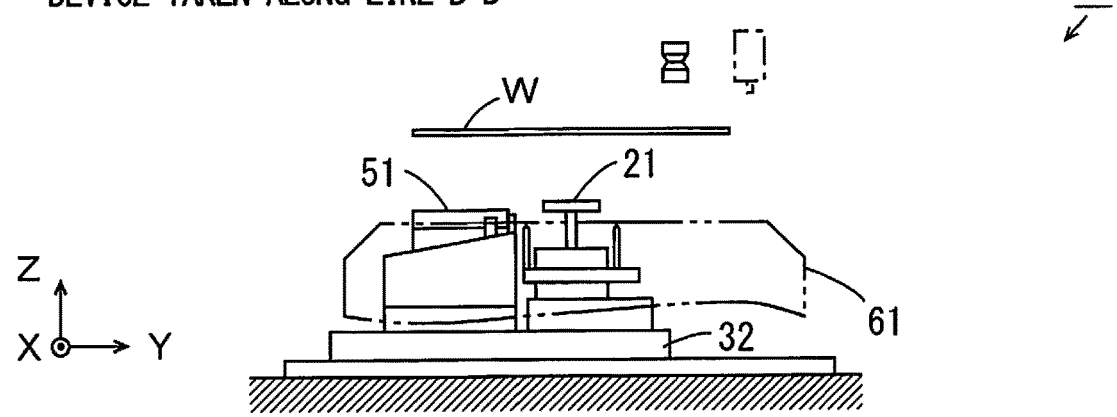

Next, as indicated by the thick solid arrows a2 in FIG. 7, the lower chucks 11A, 11B move closer to each other such that a plurality of support pieces of the lower chucks 11A, 11B are located below the lower-surface peripheral portion of the substrate W. In this state, the hand Ma is lowered and exits from the inlet-outlet port 2x. Thus, a plurality of portions of the lower-surface peripheral portion of the substrate W held by the hand Ma are supported by the plurality of support pieces of the lower chucks 11A, 11B. After the hand Ma exits, the shutter 91 closes the inlet-outlet port 2x.

Figure 8:
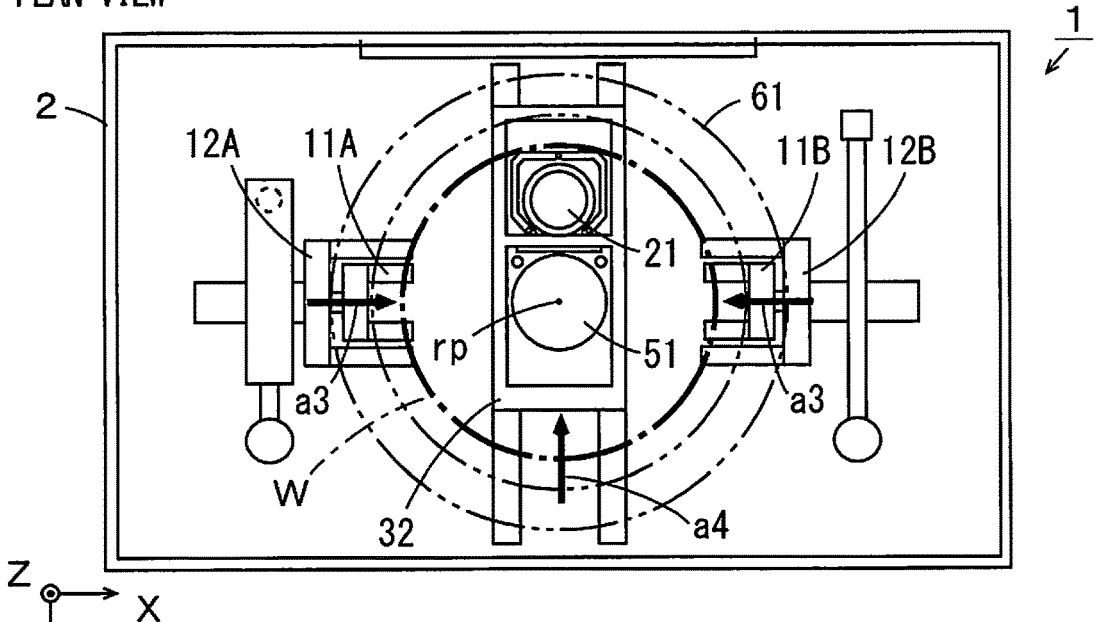
FIG. 8 is a schematic diagram for explaining one example of the operation of the substrate cleaning device of FIG. 3.
Figure 8:
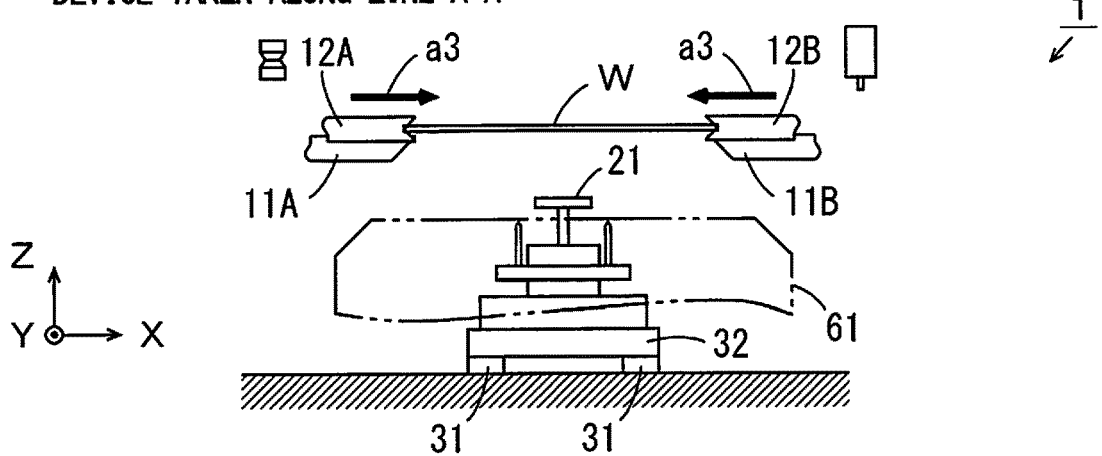
Figure 8:
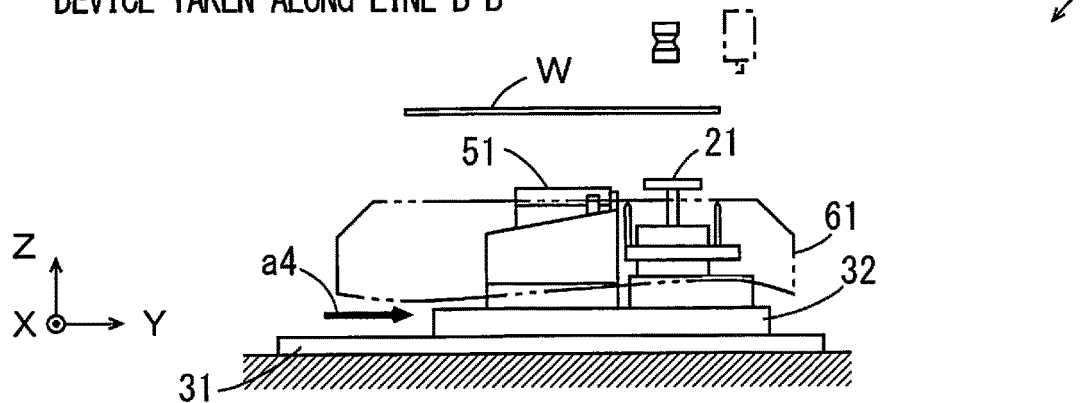

Next, as indicated by the thick solid arrows a3 in FIG. 8, the upper chucks 12A, 12B move closer to each other such that a plurality of holding pieces of the upper chucks 12A, 12B abut against the outer peripheral end of the substrate W. The plurality of holding pieces of the upper chucks 12A, 12B abut against a plurality of portions of the outer peripheral end of the substrate W, whereby the substrate W supported by the lower chucks 11A, 11B is further held by the upper chucks 12A, 12B. In this manner, the center of the substrate W held by the upper holding devices 10A, 10B overlaps or substantially overlaps with the plane reference position rp in a plan view. At this time, as shown in the side view in the middle field of FIG. 8, the height position of the substrate W held by the upper chucks 12A, 12B is equivalent to first and third height positions of the present invention. Further, as indicated by the thick solid arrow a4 in FIG. 8, the mobile base 32 is moved forwardly from the first horizontal position, such that suction holder 21 deviates from the plane reference position rp by a predetermined distance and the center of the lower-surface brush 51 is located at the plane reference position rp. At this time, the position of the mobile base 32 located on the bottom surface portion 2a is referred to as a second horizontal position.

Figure 9:
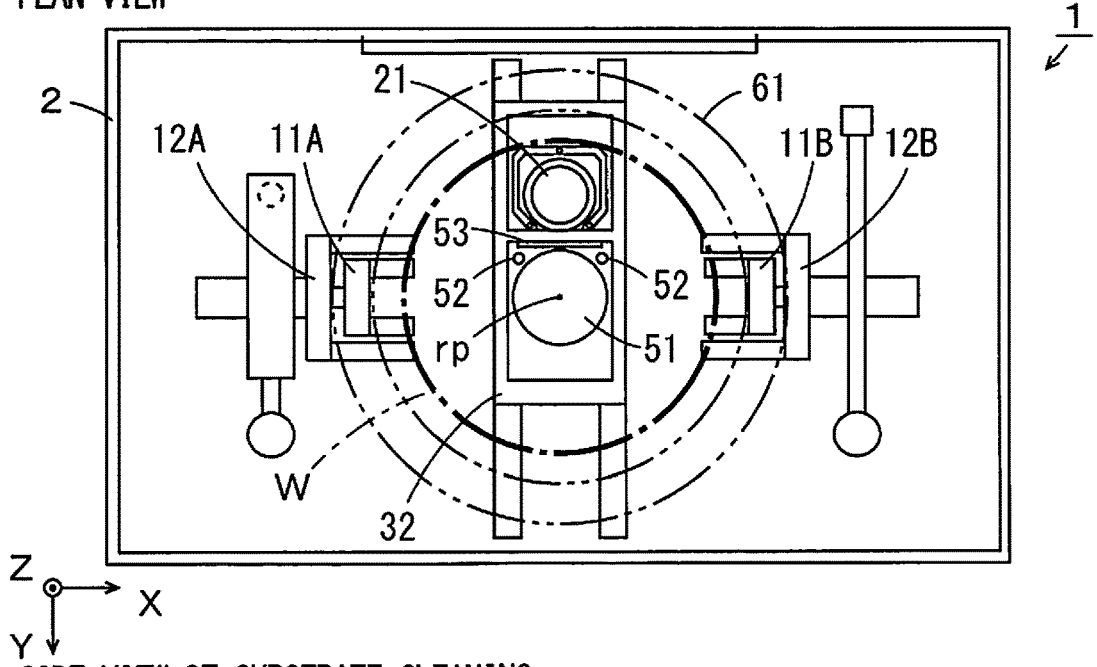
FIG. 9 is a schematic diagram for explaining one example of the operation of the substrate cleaning device of FIG. 3.
Figure 9:
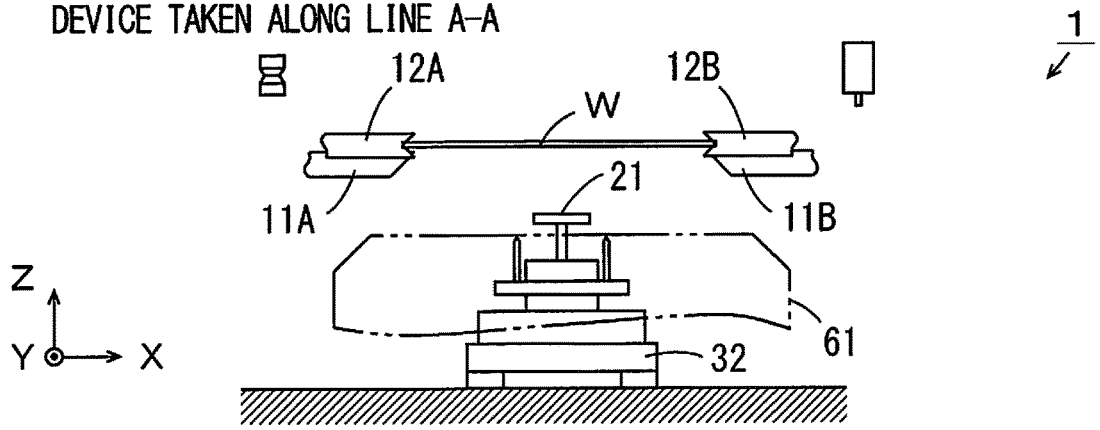
Figure 9:
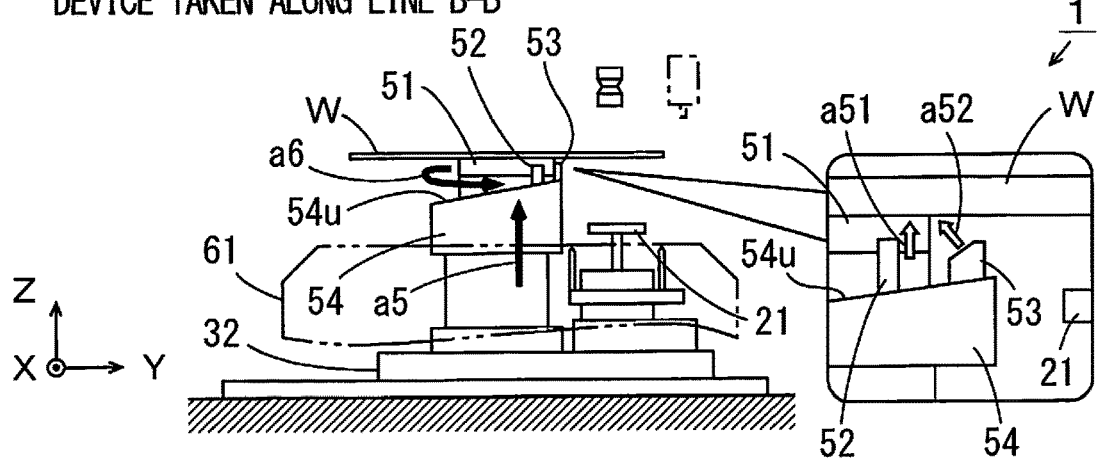

Next, as indicated by the thick solid arrow a5 in FIG. 9, the lifting-lowering supporter 54 is lifted such that the cleaning surface of the lower-surface brush 51 comes into contact with the lower-surface center portion of the substrate W. Further, as indicated by the thick solid arrow a6 in FIG. 9, the lower-surface brush 51 is rotated (spins) about the axis extending in the up-and-down direction. Thus, contaminants adhering to the lower-surface center portion of the substrate W are physically stripped by the lower-surface brush 51.

In the bottom field in FIG. 9, an enlarged side view of a portion in which the lower-surface brush 51 is in contact with the lower surface of the substrate W is shown in a balloon. As shown in the balloon, with the lower-surface brush 51 in contact with the substrate W, the liquid nozzle 52 and the gas injector 53 are held at positions close to the lower surface of the substrate W. At this time, as indicated by the outlined arrow a51, the liquid nozzle 52 discharges the cleaning liquid toward the lower surface of the substrate W at a position in the vicinity of the lower-surface brush 51. Thus, the cleaning liquid that has been supplied to the lower surface of the substrate W from the liquid nozzle 52 is guided to a contact portion in which the lower-surface brush 51 and the substrate W are in contact with each other, whereby contaminants that have been removed from the back surface of the substrate W by the lower-surface brush 51 are cleaned away by the cleaning liquid. In this manner, in the lower-surface cleaning device 50, the liquid nozzle 52 is attached to the lifting-lowering supporter 54 together with the lower-surface brush 51. Thus, the cleaning liquid can be supplied efficiently to a portion to be cleaned in the lower surface of the substrate W by the lower-surface brush 51. Therefore, the consumption of the cleaning liquid is reduced, and excessive splashing of the cleaning liquid is suppressed.

The rotation speed at which the lower-surface brush 51 is rotated when cleaning the lower surface of the substrate W is maintained at about the speed at which the cleaning liquid supplied to the lower surface of the substrate W from the liquid nozzle 52 is not splashed sidewardly of the lower-surface brush 51.

Here, the upper surface 54u of the lifting-lowering supporter 54 is inclined downwardly in a direction away from the suction holder 21. In this case, in a case where the cleaning liquid including contaminants falls on the lifting-lowering supporter 54 from the lower surface of the substrate W, the cleaning liquid received by the upper surface 54u is guided in a direction away from the suction holder 21.

Further, when the lower surface of the substrate W is cleaned by the lower-surface brush 51, the gas injector 53 injects gas toward the lower surface of the substrate W at a position between the lower-surface brush 51 and the suction holder 21 as indicated by the outlined arrow a52 in the balloon of FIG. 9. In the present embodiment, the gas injector 53 is attached onto the lifting-lowering supporter 54 such that the gas injection port extends in the X direction. In this case, when gas is injected to the lower surface of the substrate W from the gas injector 53, a strip-shaped curtain extending in the X direction is formed between the lower-surface brush 51 and the suction holder 21. Thus, when the lower surface of the substrate W is cleaned by the lower-surface brush 51, the cleaning liquid including contaminants is prevented from being splashed toward the suction holder 21. Thus, when the lower surface of the substrate W is cleaned by the lower-surface brush 51, the cleaning liquid including contaminants is prevented from adhering to the suction holder 21, and the suction surface of the suction holder 21 is maintained clean.

While the gas injector 53 injects gas obliquely upwardly toward the lower-surface brush 51 from the gas injector 53 as indicated by the outlined arrow a52 in the example of FIG. 9, the present invention is not limited to this. The gas injector 53 may inject gas in the Z direction toward the lower surface of the substrate W from the gas injector 53.

Next, in the state of FIG. 9, when the cleaning of the lower-surface center portion of the substrate W is completed, the rotation of the lower-surface brush 51 is stopped, and the lifting-lowering supporter 54 is lowered such that the cleaning surface of the lower-surface brush 51 is spaced apart from the substrate W by a predetermined distance. Further, discharging of the cleaning liquid from the liquid nozzle 52 to the substrate W is stopped. At this time, the injection of gas from the gas injector 53 to the substrate W continues.

Figure 10:
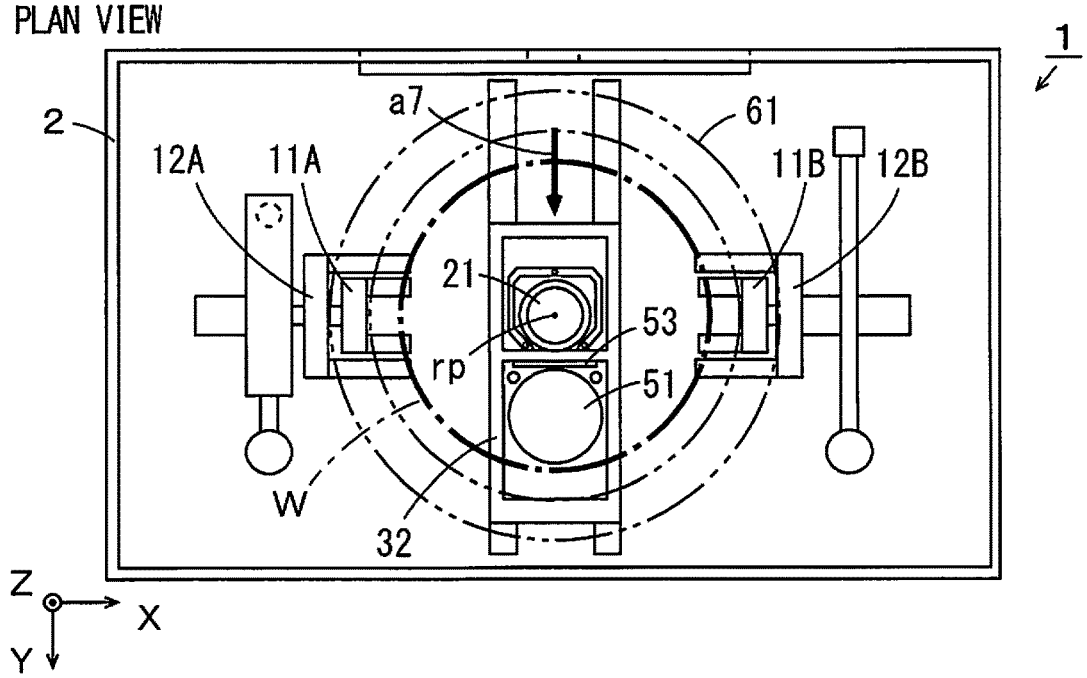
FIG. 10 is a schematic diagram for explaining one example of the operation of the substrate cleaning device of FIG. 3.
Figure 10:
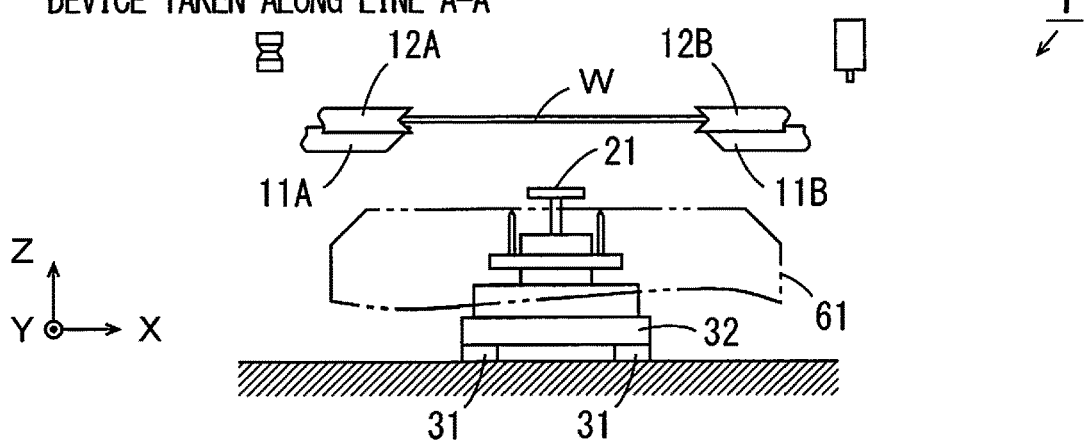
Figure 10:
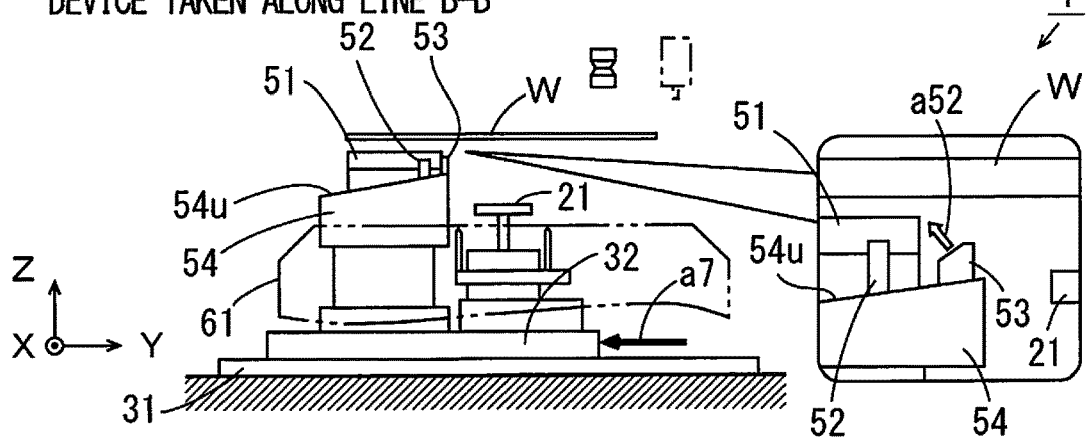

Thereafter, as indicated by the thick solid arrow a7 in FIG. 10, the mobile base 32 is moved rearwardly such that the suction holder 21 is located at the plane reference position rp. That is, the mobile base 32 is moved from the second horizontal position to the first horizontal position. At this time, the injection of gas from the gas injector 53 to the substrate W continues, so that the lower-surface center portion of the substrate W is sequentially dried by the gas curtain.

Figure 11:
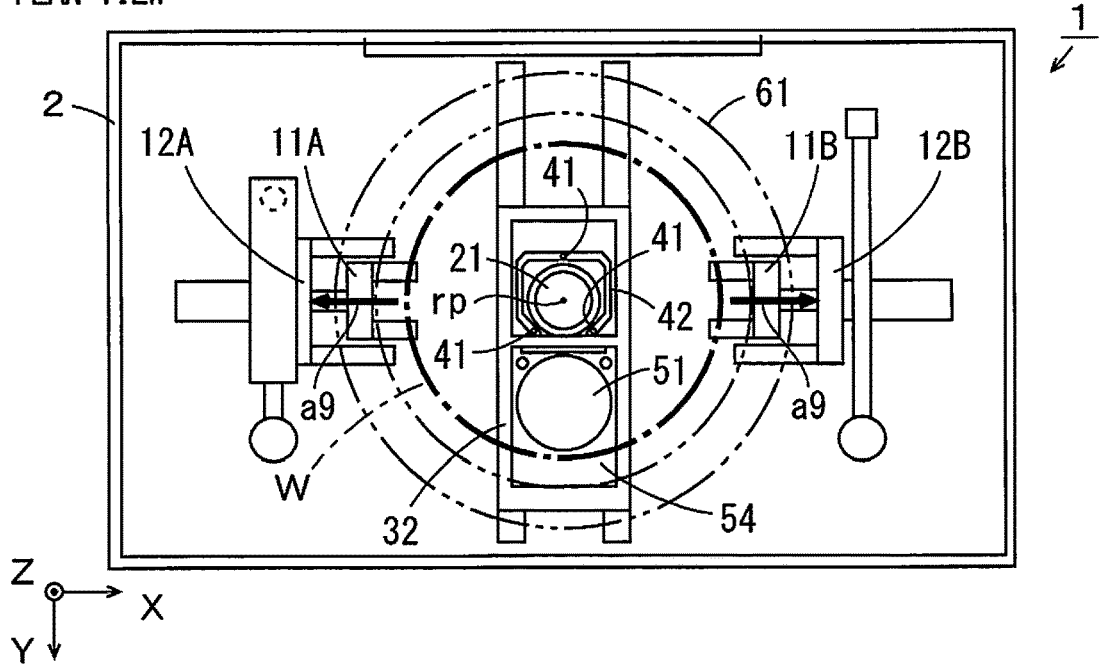
FIG. 11 is a schematic diagram for explaining one example of the operation of the substrate cleaning device of FIG. 3.
Figure 11:
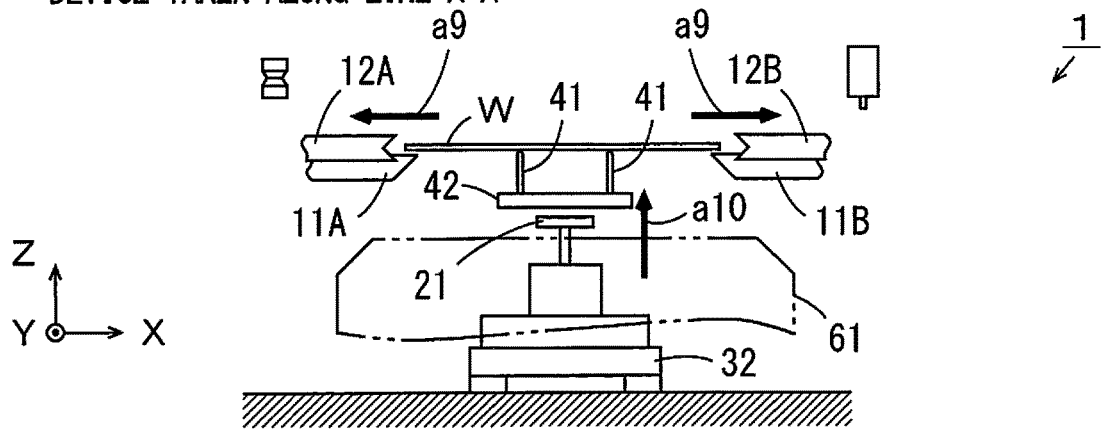
Figure 11:
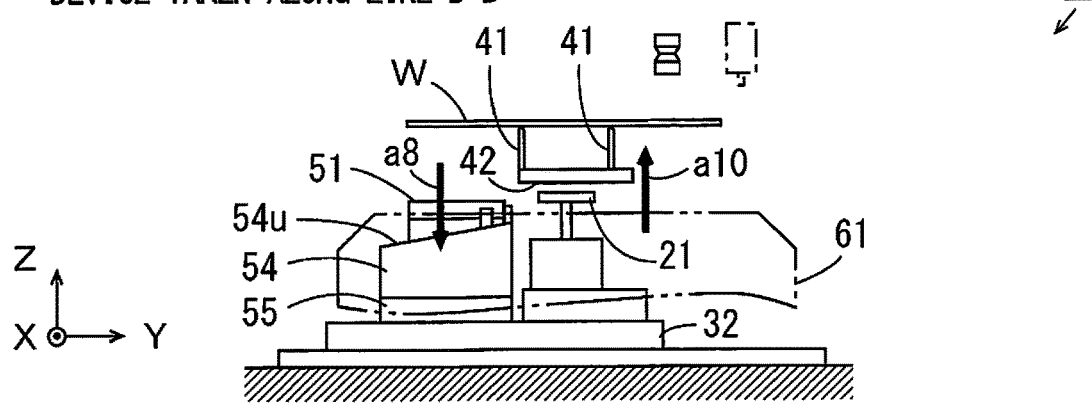

Next, as indicated by the thick solid arrow a8 in FIG. 11, the lifting-lowering supporter 54 is lowered such that the cleaning surface of the lower-surface brush 51 is located farther downwardly than the suction surface (upper end portion) of the suction holder 21. Further, as indicated by the thick solid arrows a9 in FIG. 11, the upper chucks 12A, 12B move away from each other such that the plurality of holding pieces of the upper chucks 12A, 12B are spaced apart from the outer peripheral end of the substrate W. At this time, the substrate W is being supported by the lower chucks 11A, 11B.

Thereafter, as indicated by the thick solid arrow a10 in FIG. 11, the pin coupling member 42 is lifted such that the upper end portions of the plurality of support pins 41 are located slightly farther upwardly than the lower chucks 11A, 11B. Thus, the substrate W supported by the lower chucks 11A, 11B is received by the plurality of support pins 41.

Figure 12:
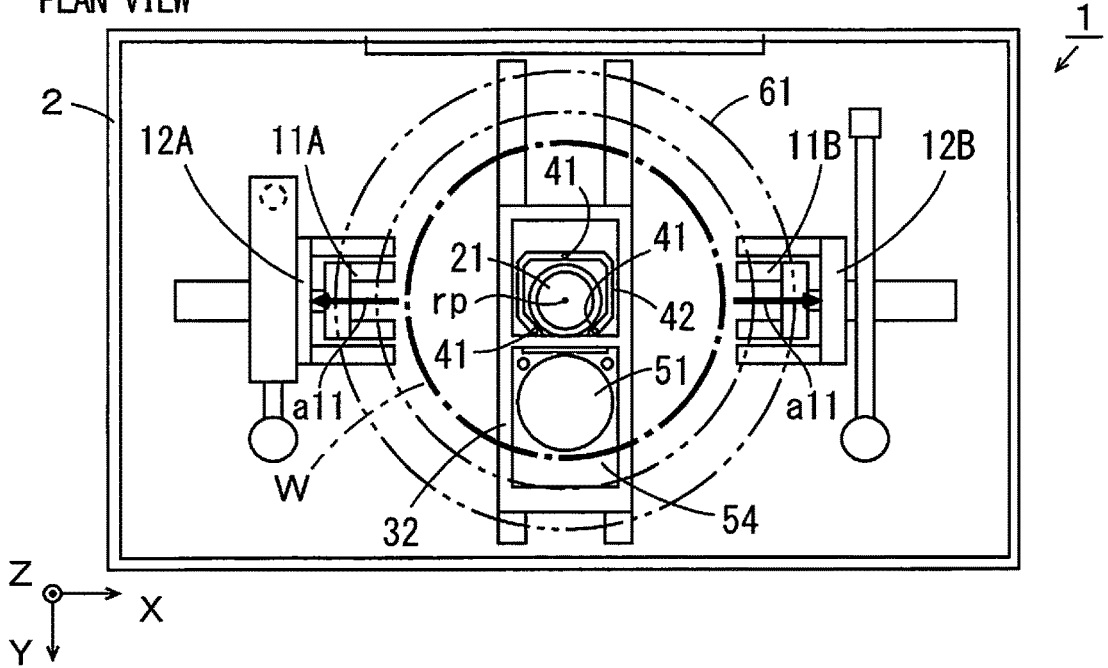
FIG. 12 is a schematic diagram for explaining one example of the operation of the substrate cleaning device of FIG. 3.
Figure 12:
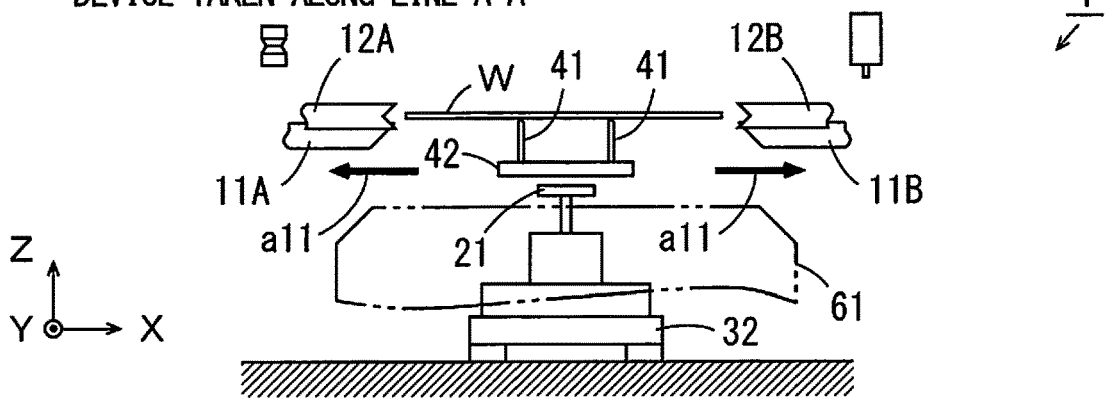
Figure 12:
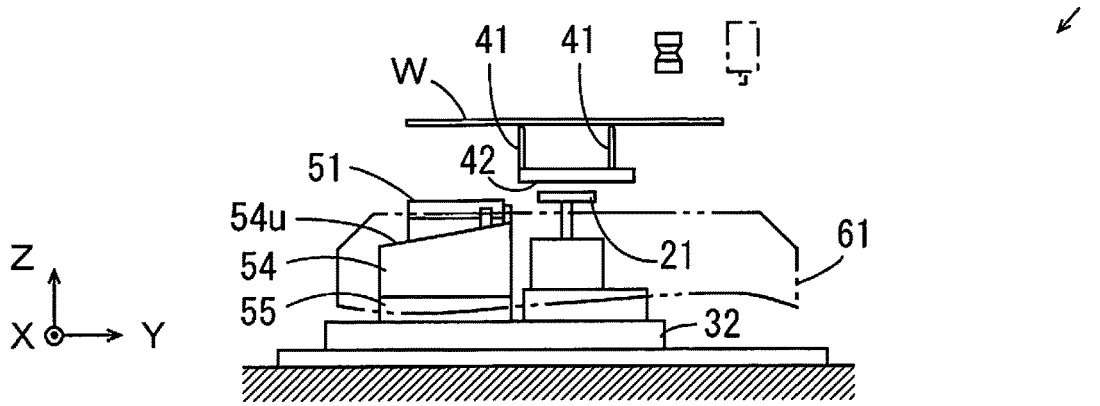

Next, as indicated by the thick solid arrows a11 in FIG. 12, the lower chucks 11A, 11B move away from each other. At this time, the lower chucks 11A, 11B move to positions at which the lower chucks 11A, 11B do not overlap with the substrate W supported by the plurality of support pins 41 in a plan view. Thus, both of the upper holding devices 10A, 10B return to the initial state.

Figure 13:
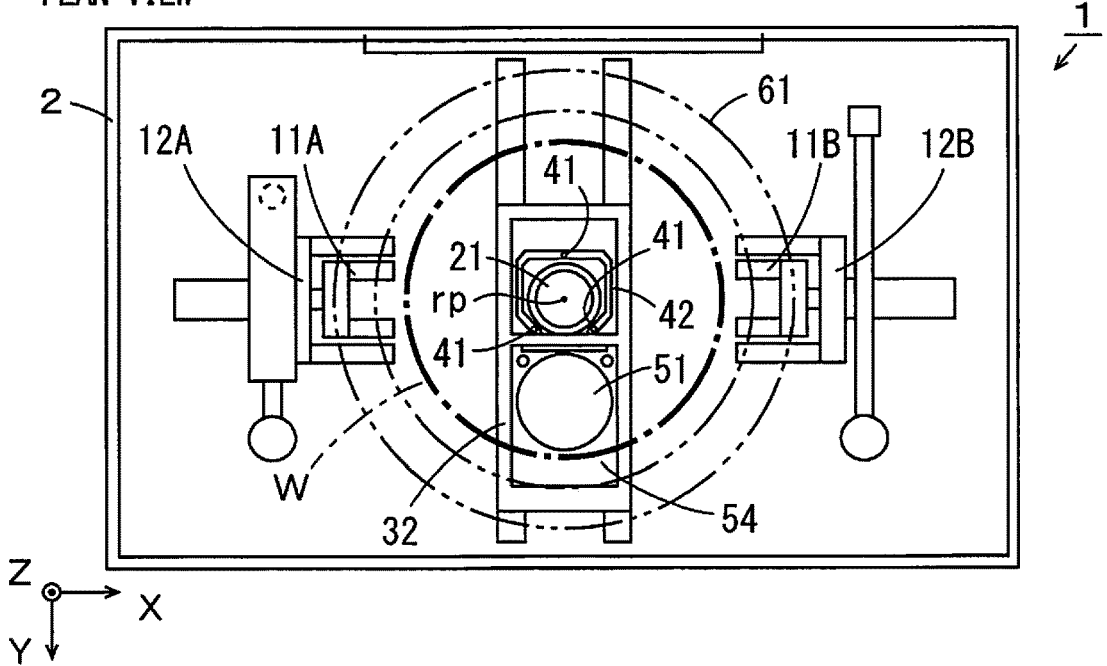
FIG. 13 is a schematic diagram for explaining one example of the operation of the substrate cleaning device of FIG. 3.
Figure 13:
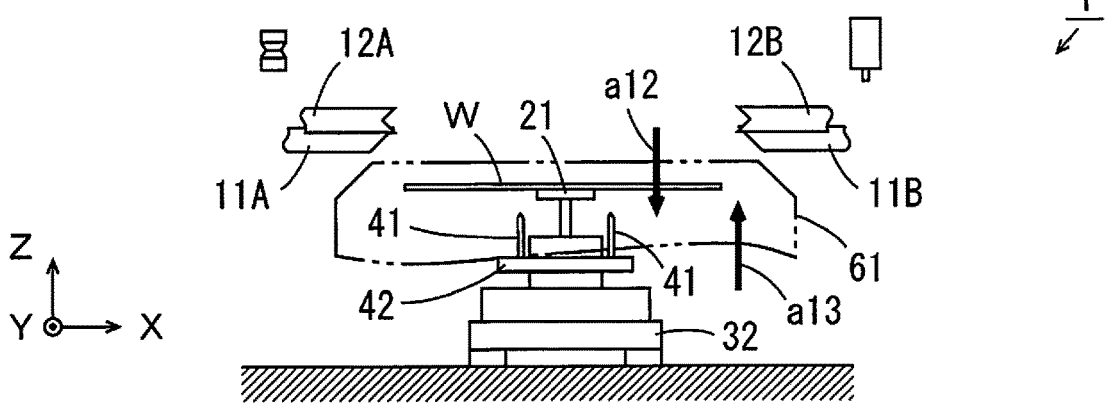
Figure 13:
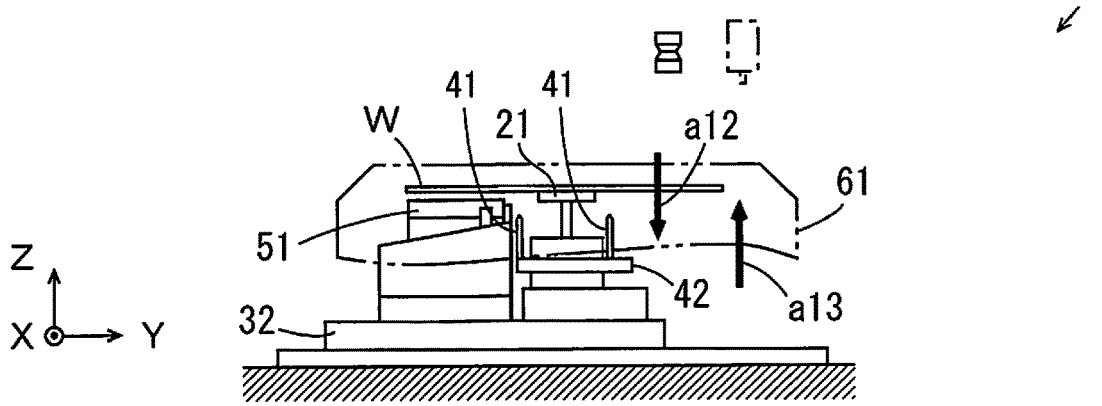

Next, as indicated by the thick solid arrow a12 in FIG. 13, the pin coupling member 42 is lowered such that the upper end portions of the plurality of support pins 41 are located farther downwardly than the suction holder 21. Thus, the substrate W supported on the plurality of support pins 41 is received by the suction holder 21. In this state, the suction holder 21 holds the lower-surface center portion of the substrate W by suction. In this manner, the center of the substrate W held by suction by the lower holding device 20 overlaps or substantially overlaps with the plane reference position rp in a plan view. At this time, as shown in the side views in the middle and lower fields of FIG. 13, the height position of the substrate W held by suction by the suction holder 21 is equivalent to the second and fourth height positions of the present invention. At the same time as the pin coupling member 42 is lowered or after the pin coupling member 42 is lowered, the processing cup 61 is lifted from the lower cup position to the upper cup position as indicated by the thick solid arrow a13 in FIG. 13. Thus, the substrate W being in the second height position is located farther downwardly than the upper end portion of the processing cup 61.

Figure 14:
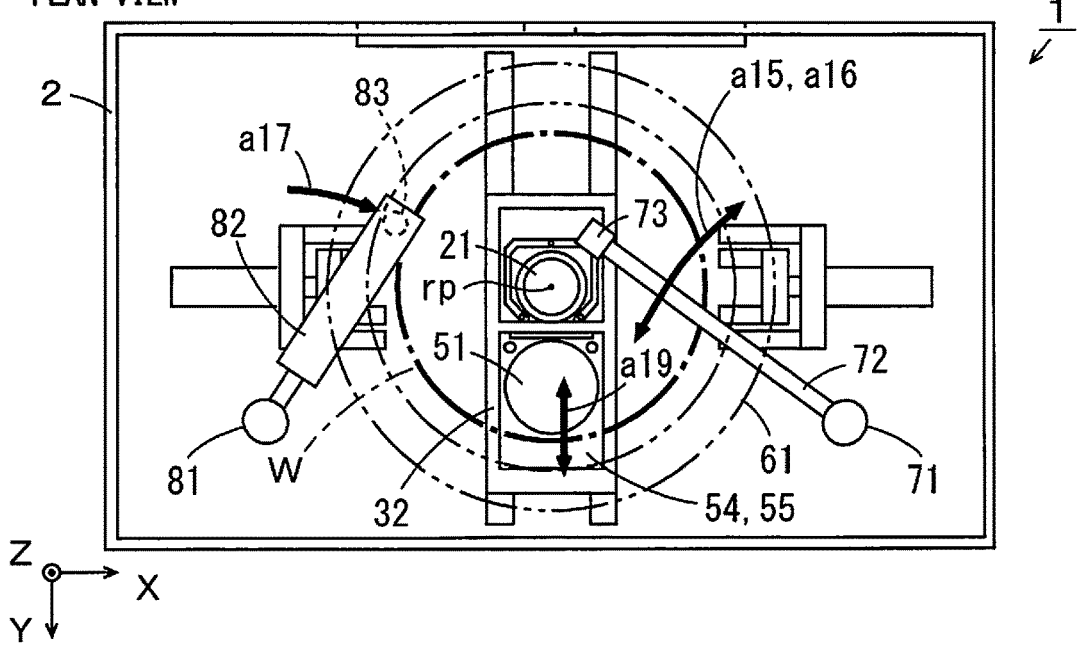
FIG. 14 is a schematic diagram for explaining one example of the operation of the substrate cleaning device of FIG. 3.
Figure 15:
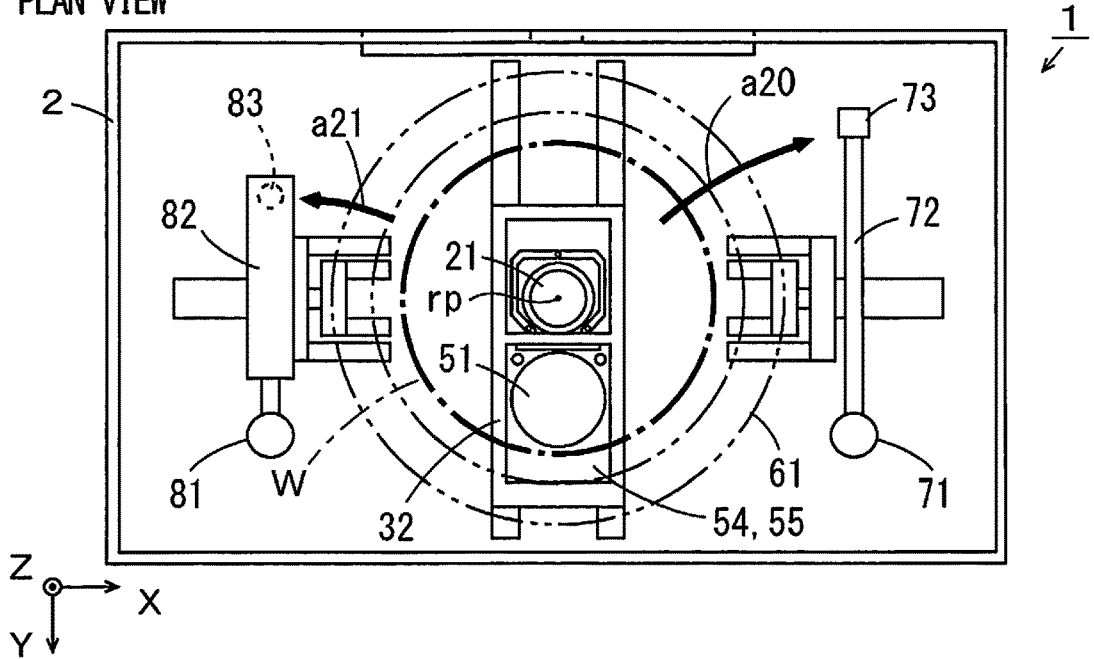
FIG. 15 is a schematic diagram for explaining one example of the operation of the substrate cleaning device of FIG. 3.
Figure 15:
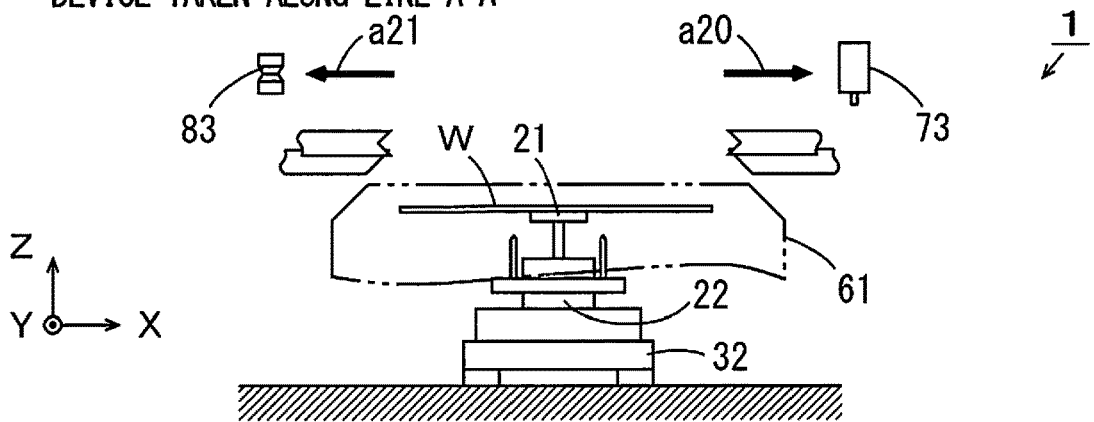
Figure 15:
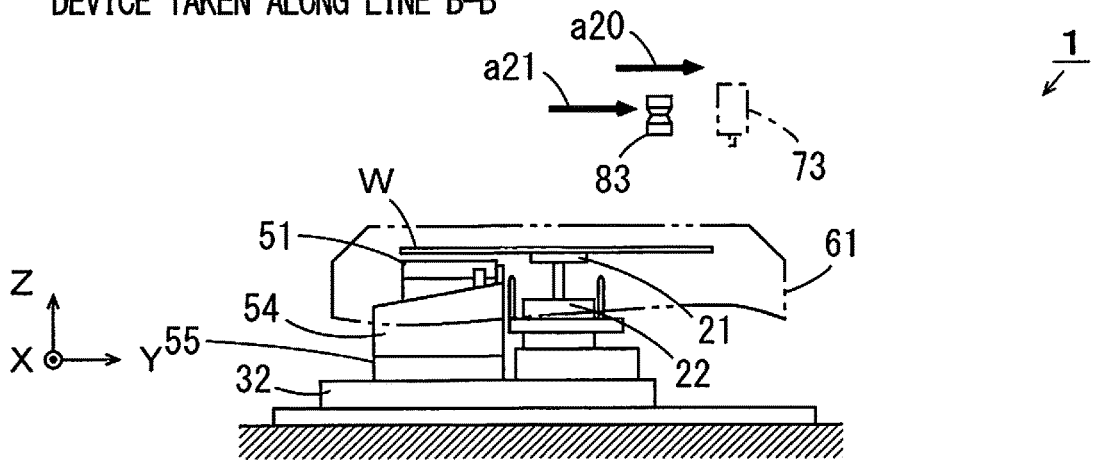

Next, as indicated by the thick solid arrow a14 in FIG. 14, the suction holder 21 rotates about the axis extending in the up-and-down direction (an axial center of the rotation shaft of the suction holding driver 22). Thus, the substrate W held by suction by the suction holder 21 is rotated in a horizontal attitude.

Next, the rotation support shaft 71 of the upper-surface cleaning device 70 is rotated and lowered. Thus, as indicated by the thick solid arrow a15 in FIG. 14, the spray nozzle 73 is moved to a position above the substrate W, and the spray nozzle 73 is lowered such that the distance between the spray nozzle 73 and the substrate W is a predetermined distance. In this state, the spray nozzle 73 injects the fluid mixture of the cleaning liquid and gas to the upper surface of the substrate W. Further, the rotation support shaft 71 is rotated. Thus, as indicated by the thick solid arrow a16 in FIG. 14, the spray nozzle 73 is moved at a position above the rotating substrate W. The fluid mixture is injected to the entire upper surface of the substrate W, so that the entire upper surface of the substrate W is cleaned.

Further, when the upper surface of the substrate W is cleaned by the spray nozzle 73, the rotation support shaft 81 of the end-portion cleaning device 80 is rotated and lowered. Thus, as indicated by the thick solid arrow a17 in FIG. 14, the bevel brush 83 is moved to a position above the outer peripheral end of the substrate W. Further, the bevel brush 83 is lowered such that the center portion of the outer peripheral surface of the bevel brush 83 comes into contact with the outer peripheral end of the substrate W. In this state, the bevel brush 83 is rotated (spins) about the axis extending in the up-and-down direction. Thus, contaminants adhering to the outer peripheral end of the substrate W are physically stripped by the bevel brush 83. The contaminants that have been stripped from the outer peripheral end of the substrate W are cleaned away by the cleaning liquid of the fluid mixture injected from the spray nozzle 73 to the substrate W.

Further, when the upper surface of the substrate W is cleaned by the spray nozzle 73, the lifting-lowering supporter 54 is lifted such that the cleaning surface of the lower-surface brush 51 comes into contact with the lower-surface outer region of the substrate W. Further, as indicated by the thick solid arrow a18 in FIG. 14, the lower-surface brush 51 is rotated (spins) about the axis extending in the up-and-down direction. Further, the liquid nozzle 52 discharges the cleaning liquid toward the lower surface of the substrate W, and the gas injector 53 injects the gas toward the lower surface of the substrate W. In this state, as indicated by the thick solid arrow a19 in FIG. 14, the movement supporter 55 advances or retreats between the proximal position and the distal position on the mobile base 32. In this manner, the lower-surface brush 51 is moved in the horizontal direction by the movement supporter 55 while being in contact with the lower surface of the substrate W, whereby a range of the area that can be cleaned by the lower-surface brush 51 in the lower surface of the substrate W is expanded. Thus, the entire lower-surface outer region of the substrate W held by suction and rotated by the suction holder 21 is cleaned by the lower-surface brush 51.

Next, when cleaning of the upper surface, the outer peripheral end and the lower-surface outer region of the substrate W is completed, injection of the fluid mixture from the spray nozzle 73 to the substrate W is stopped. Further, as indicated by the thick solid arrow a20 in FIG. 15, the spray nozzle 73 is moved to a position near one side of the processing cup 61 (the position in the initial state). Further, as indicated by the thick solid arrow a21 in FIG. 15, the bevel brush 83 is moved to a position near the other side of the processing cup (the position in the initial state). Further, the rotation of the lower-surface brush 51 is stopped, and the lifting-lowering supporter 54 is lowered such that the cleaning surface of the lower-surface brush 51 is spaced apart from the substrate W by a predetermined distance. Further, the discharging of the cleaning liquid from the liquid nozzle 52 to the substrate W and the injection of gas from the gas injector 53 to the substrate W are stopped. In this state, the suction holder 21 is rotated at a high speed, so that the cleaning liquid adhering to the substrate W is shaken off, and the entire substrate W is dried.

Figure 16:
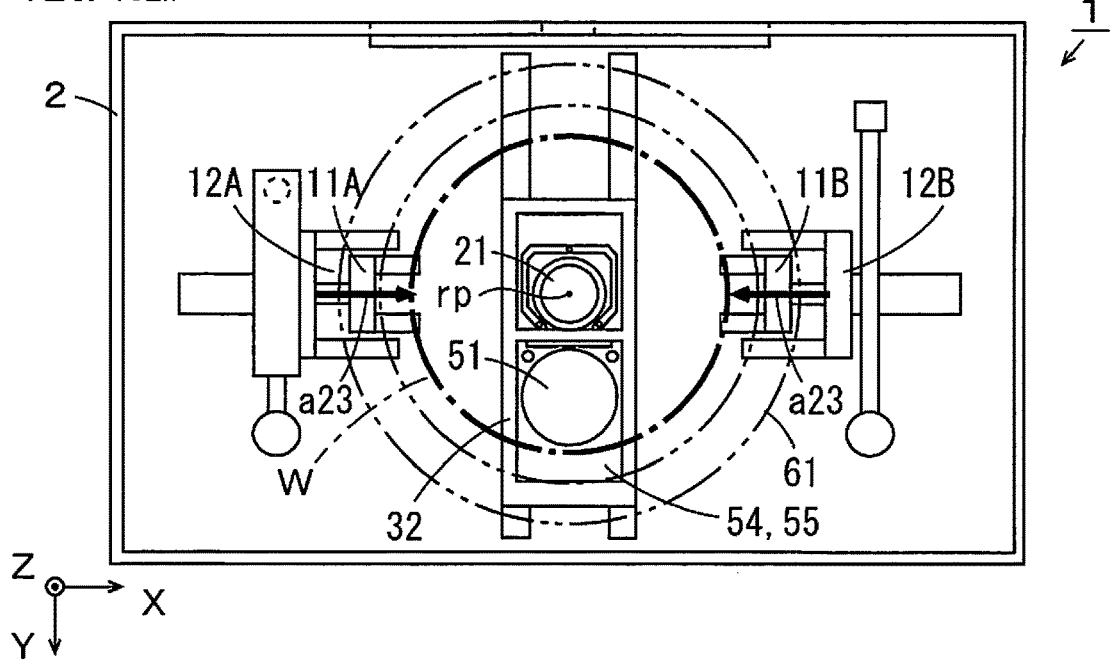
FIG. 16 is a schematic diagram for explaining one example of the operation of the substrate cleaning device of FIG. 3.
Figure 16:
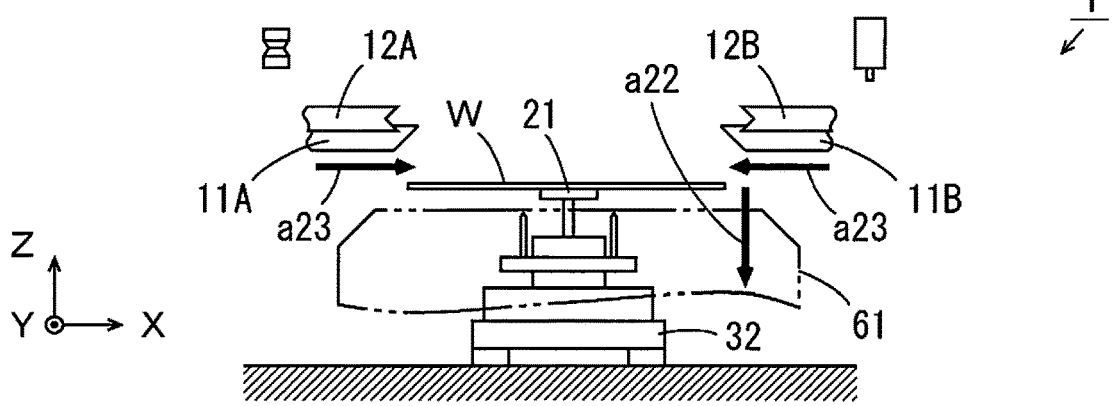
Figure 16:
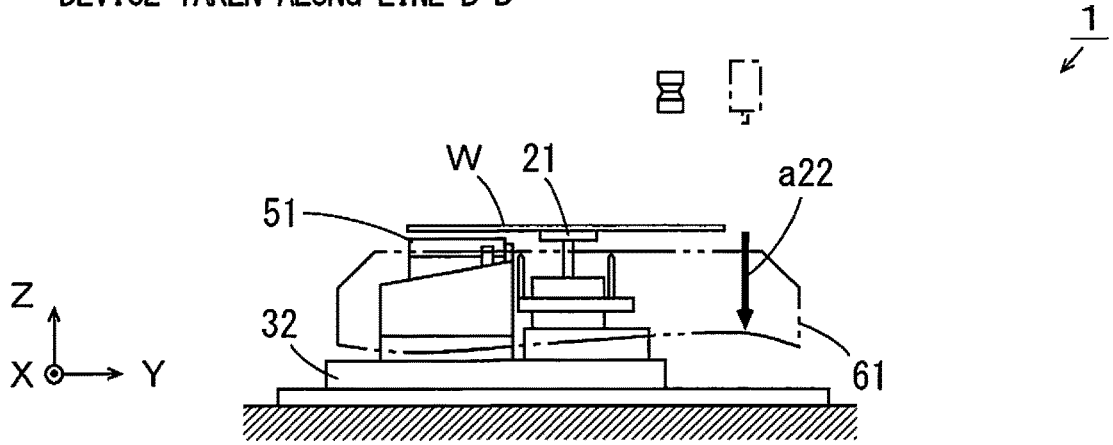
Figure 17:
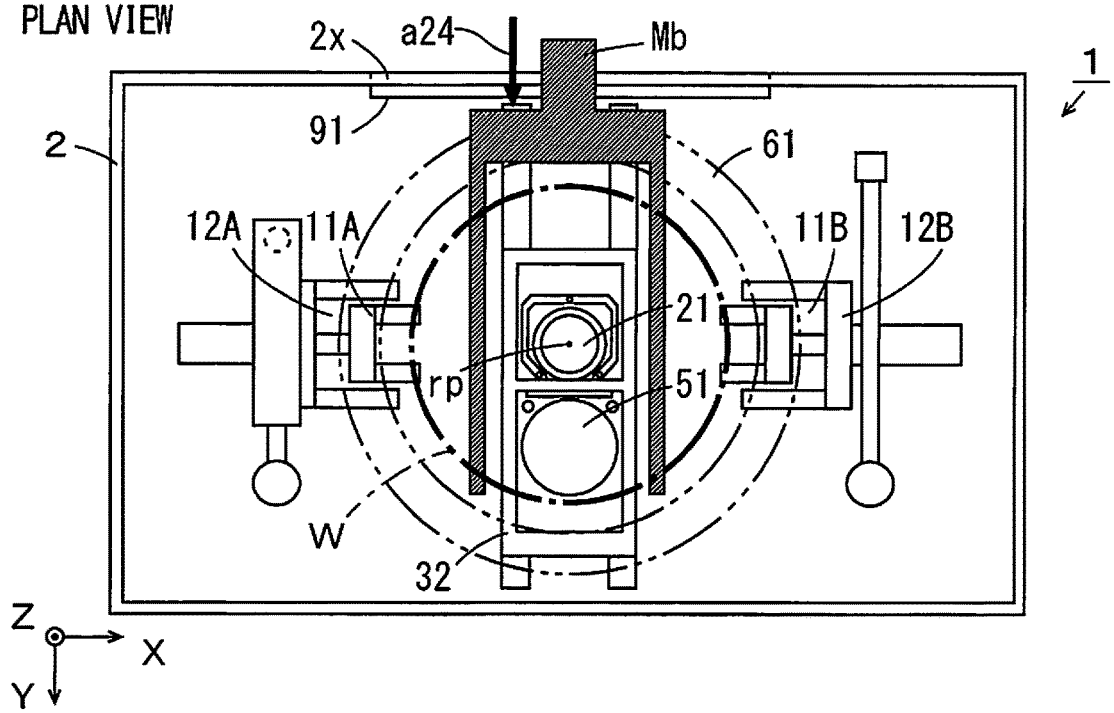
FIG. 17 is a schematic diagram for explaining one example of the operation of the substrate cleaning device of FIG. 3.
Figure 17:
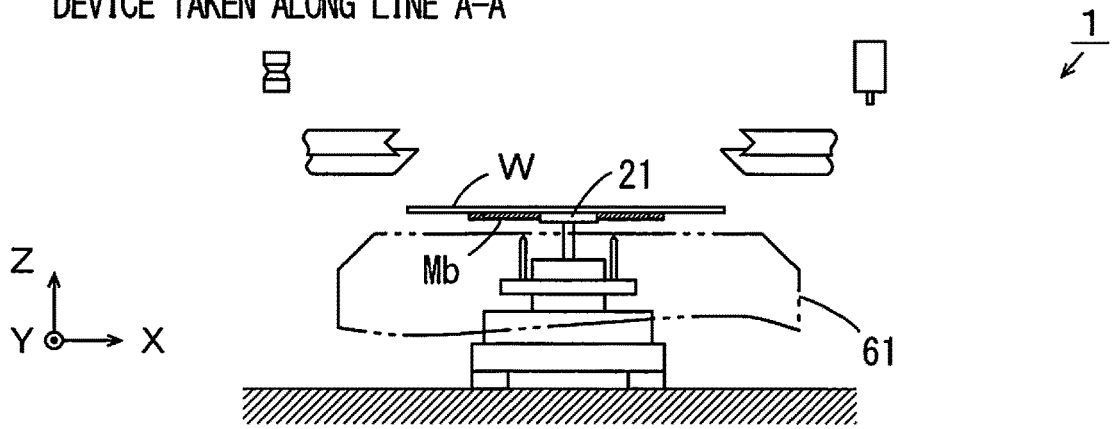
Figure 17:
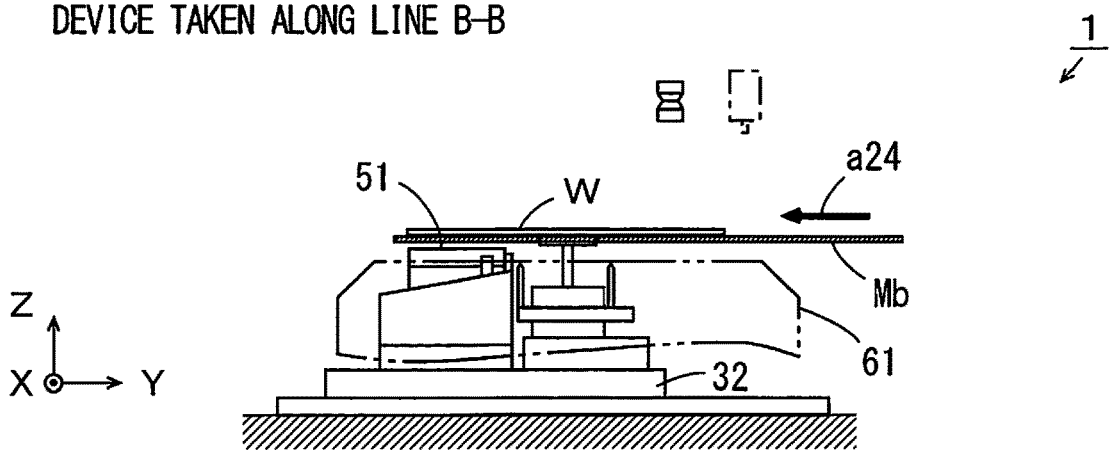

Next, as indicated by the thick solid arrow a22 in FIG. 16, the processing cup 61 is lowered from the upper cup position to the lower cup position. Thus, the substrate W being in the second height position is located farther upwardly than the upper end portion of the processing cup 61. Further, as indicated by the thick solid arrows a23 in FIG. 16, the lower chucks 11A, 11B move closer to each other to a position at which the lower chucks 11A, 11B can support a new substrate W in preparation for the new substrate W being carried into the unit casing 2.

Finally, the substrate W is carried out from the unit casing 2 of the substrate cleaning device 1. Specifically, the shutter 91 opens the inlet-outlet port 2x immediately before the substrate W is carried out. Thereafter, as indicated by the thick solid arrow a24 in FIG. 17, the hand Mb of the main robot 300 of FIG. 1 enters the unit casing 2 through the inlet-outlet port 2x. Subsequently, the hand Mb receives the substrate W on the suction holder 21 and exits from the inlet-outlet port 2x. After the hand Mb exits, the shutter 91 closes the inlet-outlet port 2x.

[5] One Example of Operation of Main Robot 300 with Respect to Substrate Cleaning Device 1

Figure 18:
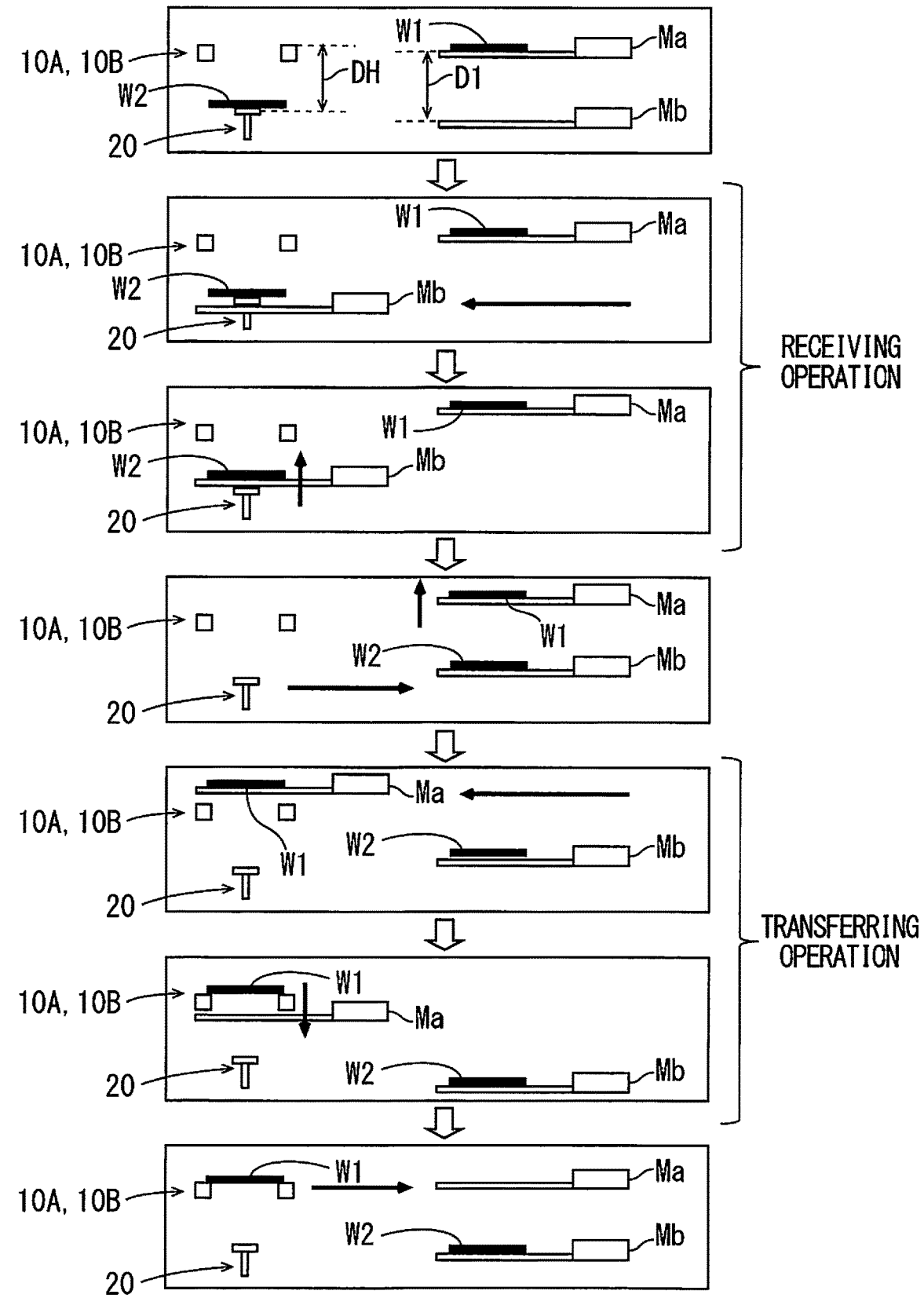
FIG. 18 is a diagram for explaining one example of the operation performed by a main robot of FIG. 1 with respect to the substrate cleaning device.

FIG. 18 is a diagram for explaining one example of an operation to be performed by the main robot 300 of FIG. 1 with respect to a substrate cleaning device 1. In FIG. 18, operations of carrying substrates W1, W2 into the substrate cleaning device 1 and carrying the substrates W1, W2 out from the substrate cleaning device 1 to be performed by the main robot 300 are shown in a chronological order in a plurality of side views. In each side view, the upper holding devices 10A, 10B and the lower holding device 20 of the substrate cleaning device 1, and the hands Ma, Mb of the main robot 300 are schematically shown. In the present example, one pair of hands that carries a substrate W into and carries the substrate W out from one substrate cleaning device 1 is constituted by the hands Ma, Mb. Further, the inter-hand distance D1 between the hands Ma, Mb is substantially equal to the distance DH (hereinafter referred to as an inter-holder distance) between the height position of a substrate W to be held by the upper holding devices 10A, 10B and the height position of a substrate W to be held by suction by the lower holding device 20.

In the following description, in order to facilitate distinction between a processed substrate W and an unprocessed substrate W, an unprocessed substrate W is suitably referred to as a substrate W1, and a processed (a cleaning process, in the present example) substrate W is suitably referred to as a substrate W2.

As shown in the side view at the top in FIG. 18, in an initial state, the processed substrate W2 is held by the lower holding device 20. Further, the unprocessed substrate W1 is held by the upper hand Ma of the main robot MR. Further, in the initial state, the hand Mb is arranged to be opposite to the lower holding device 20 at a position slightly downward than the upper end portion of the lower holding device 20. Further, the hand Ma is arranged to be opposite to the upper holding devices 10A, 10B at a position slightly downward than the upper end portions of the upper holding devices 10A, 10B.

First, the substrate W2 held by the lower holding device 20 is carried out. In this case, as shown in the second side view from the top in FIG. 18, the hand Mb advances to a position below the substrate W2 held by the lower holding device 20.

Next, as shown in the third side view from the top in FIG. 18, the hand Mb is lifted and receives the substrate W2 held by the lower holding device 20. Further, the hand Mb that has received the substrate W2 retreats from the substrate cleaning device 1, and carries the substrate W2 out from the substrate cleaning device 1 as shown in the fourth side view from the top in FIG. 18. Further, the hand Ma is lifted to a position slightly upward than the upper holding devices 10A, 10B.

Then, as shown in the fifth side view from the top in FIG. 18, the hand Ma advances such that the substrate W1 is located above the upper holding devices 10A, 10B. Further, the hand Ma is lowered, and the substrate W1 held by the hand Ma is transferred to the upper holding devices 10A, 10B as shown in the sixth side view from the top in FIG. 18. Thereafter, the substrate W1 is held by the upper holding devices 10A, 10B, and the hand Ma retreats from the substrate cleaning device 1. Then, as shown in the seventh side view from the top in FIG. 18, the hand Ma exits from the substrate cleaning device 1. In this manner, the unprocessed substrate W1 and the substrate W2 on which the cleaning process has been performed are replaced with each other with respect to the substrate cleaning device 1.

At the time of above-mentioned replacement, when receiving the substrate W2 from the lower holding device 20, the hand Mb is located at substantially the same height as the suction holder 21 (FIG. 4) of the lower holding device 20. At this time, the height position of the hand Ma is closer to the height positions of the upper holding devices 10A, 10B than the hand Mb. Further, when the hand Ma of the main robot 300 transfers the substrate W1 to the upper holding devices 10A, 10B of the substrate cleaning device 1, the hand Ma is located at substantially the same height as the upper holding devices 10A, 10B. At this time, the height position of the hand Mb is close to the height position of the suction holder 21 (FIG. 4) of the lower holding device 20 than the hand Ma.

Therefore, the distance by which the hands Ma, Mb are required to be moved in the up-and-down direction between the position at which the hand Mb perform the operation of receiving the substrate W2 from the lower holding device 20 (the operations shown in the second and third side views from the top in FIG. 18) and the position at which the hand Ma is to perform the operation of transferring the substrate W to the upper holding devices 10A, 10B (the operations shown in the fifth and sixth side views from the top in FIG. 18) is reduced. That is, as compared to reception and transfer of the substrates W1, W2 only at one height position between the substrate cleaning device 1 and the main robot 300, the distance by which the hands Ma, Mb are to be moved in the up-and-down direction is reduced. As a result, the throughput of the substrate cleaning device 1 can be improved.

With the above-mentioned reasons, in the main robot 300, two pairs of hands are defined such that the inter-hand distances are equal to each other and their inter-hand distances are close to the inter-holder distance DH of the substrate cleaning device 1. It is preferable that the inter-hand distance D1 and the inter-holder distance DH are equal or substantially equal to each other. In this case, the distance by which a pair of hands is to be moved in the up-and-down direction between the position at which one hand performs a receiving operation and the position at which the other hand of each pair of hands performs a transferring operation can be sufficiently reduced. Therefore, the throughput of the substrate cleaning device 1 is further improved.

[6] Operation Patterns of Main Robot 300 in Processing Block 120 with Use of Four Hands MA to MD In the following description, one substrate cleaning device 1 out of the plurality of substrate cleaning devices 1 provided in the processing block 120 of FIG. 1 is suitably referred to as a substrate cleaning device 1A, and another substrate cleaning device 1 out of the plurality of substrate cleaning devices 1 is suitably referred to as a substrate cleaning device 1B.

In the processing block 120, the main robot 300 can basically transport two substrates W by accessing a substrate platform PASS2, the one substrate cleaning device 1A, the other substrate cleaning device 1B and a substrate platform PASS1 in this order.

FIG. 19 is a diagram showing one example of a specific operation pattern of the main robot 300 in the processing block 120. In FIG. 19, the operations performed by the hands Ma to Md when the main robot 300 accesses the substrate platform PASS2, the one substrate cleaning device 1A, the other substrate cleaning device 1B and the substrate platform PASS1 are shown in a chronological order indicated by the outlined arrow. In an initial state, a plurality of unprocessed substrates W1 are respectively placed on the plurality of substrate platforms PASS2, and the plurality of substrate platforms PASS1 are empty. Further, in the plurality of substrate cleaning devices 1 in the processing block 120, processed substrates W2 are held by the lower holding devices 20.

Here, in the operation pattern in FIG. 19, out of the four hands Ma to Md of the main robot 300, the hand Ma at the top and the hand Mc located third from the top constitute one pair of hands. Further, the hand Mb located second from the top and the hand Md at the bottom constitute the other pair of hands. Therefore, in the present example, the hand Ma functions as a first transport holder of the present invention, and the hand Mc functions as a second transport holder of the present invention. Further, the hand Mb functions as a third transport holder of the present invention, and the hand Md functions as a fourth transport holder of the present invention.

As shown in FIG. 19, the main robot 300 first causes the hands Ma, Mb to be opposite to two substrate platforms PASS2 by rotating, lifting or lowering the hand support member 310 (FIG. 1). In this state, the main robot 300 receives two unprocessed substrates W1 from the two substrate platforms PASS2 by causing the hands Ma, Mb to advance or retreat.

Next, the main robot 300 causes the hands Ma, Mc to be opposite to the substrate cleaning device 1A by rotating, lifting or lowering the hand support member 310 (FIG. 1). In this state, the main robot 300 transfers an unprocessed substrate W1 to the upper holding devices 10A, 10B of the substrate cleaning device 1A by performing the transferring operation using the hand Ma (see the fifth and sixth side views from the top in FIG. 18). Further, the main robot 300 receives a processed substrate W2 from the lower holding device 20 of the substrate cleaning device 1A by performing the receiving operation using the hand Mc (see the second and third side views from the top in FIG. 18). The transferring operation with the use of the hand Ma and the receiving operation with the use of the hand Mc may be performed in this order, performed in a reverse order or performed simultaneously in parallel.

Next, the main robot 300 causes the hands Mb, Md to be opposite to the substrate cleaning device 1B by rotating, lifting or lowering the hand support member 310 (FIG. 1). In this state, the main robot 300 transfers an unprocessed substrate W1 to the upper holding devices 10A, 10B of the substrate cleaning device 1B by performing the transferring operation using the hand Mb (see the fifth and sixth side views from the top in FIG. 18). Further, the main robot 300 receives a processed substrate W2 from the lower holding device 20 of the substrate cleaning device 1B by performing the receiving operation using the hand Md (see the second and third side views from the top in FIG. 18). The transferring operation with the use of the hand Mb and the receiving operation with the use of the hand Md may be performed in this order, performed in a reverse order or performed simultaneously in parallel.

Next, the main robot 300 causes the hands Mc, Md to be opposite to the substrate platform PASS1 by rotating, lifting or lowering the hand support member 310 (FIG. 1). In this state, the main robot 300 transfers two processed substrates W2 to the two substrate platforms PASS1 by causing the hands Mc, Md to advance or retreat.

FIG. 20 is a diagram showing another example of the specific operation pattern of the main robot 300 in the processing block 120. In FIG. 20, similarly to the example of FIG. 19, the operations to be performed by the hands Ma to Md when the main robot 300 accesses the substrate platform PASS2, the one substrate cleaning device 1A, the other substrate cleaning device 1B and the substrate platform PASS1 are shown in a chronological order indicated by the outlined arrow. In an initial state, a plurality of unprocessed substrates W1 are respectively placed on the plurality of substrate platforms PASS2, and the plurality of substrate platforms PASS1 are empty. Further, in the plurality of substrate cleaning devices 1 in the processing block 120, processed substrates W2 are held by the lower holding devices 20.

Here, in the operation pattern of FIG. 20, out of the four hands Ma to Md of the main robot 300, two upper hands Ma, Mb constitute one pair of hands. Further, two lower hands Mc, Md constitute the other pair of hands. Thus, in the present example, the hand Ma functions as a first transport holder of the present invention, and the hand Mb functions as a second transport holder of the present invention. Further, the hand Mc functions as a third transport holder of the present invention, and the hand Md functions as a fourth transport holder of the present invention.

As shown in FIG. 20, the main robot 300 first causes the hands Ma, Mc to be opposite to two substrate platforms PASS2 by rotating, lifting or lowering the hand support member 310 (FIG. 1). In this state, the main robot 300 receives two unprocessed substrates W1 from the two substrate platforms PASS2 by causing the hands Ma, Mc to advance or retreat.

Next, the main robot 300 causes the hands Ma, Mb to be opposite to the substrate cleaning device 1A by rotating, lifting or lowering the hand support member 310 (FIG. 1). In this state, the main robot 300 transfers an unprocessed substrate W1 to the upper holding devices 10A, 10B of the substrate cleaning device 1A by performing the transferring operation using the hand Ma (see the fifth and sixth side views from the top in FIG. 18). Further, the main robot 300 receives a processed substrate W2 from the lower holding device 20 of the substrate cleaning device 1A by performing the receiving operation using the hand Mb (see the second and third side views from the top in FIG. 18). The transferring operation with the use of the hand Ma and the receiving operation with the use of the hand Mb may be performed in this order, performed in a reverse order or performed simultaneously in parallel.

Next, the main robot 300 causes the hands Mc, Md to be opposite to the substrate cleaning device 1B by rotating, lifting or lowering the hand support member 310 (FIG. 1). In this state, the main robot 300 transfers an unprocessed substrate W1 to the upper holding devices 10A, 10B of the substrate cleaning device 1B by performing the transferring operation using the hand Mc (see the fifth and sixth side views from the top in FIG. 18). Further, the main robot 300 receives a processed substrate W2 from the lower holding device 20 of the substrate cleaning device 1B by performing the receiving operation using the hand Md (see the second and third side views from the top in FIG. 18). The transferring operation with the use of the hand Mc and the receiving operation with the use of the hand Md may be performed in this order, performed in a reverse order or performed simultaneously in parallel.

Next, the main robot 300 causes the hands Mb, Md to be opposite to two substrate platforms PASS1 by rotating, lifting or lowering the hand support member 310 (FIG. 1). In this state, the main robot 300 transfers two processed substrates W2 to the two substrate platforms PASS1 by causing the hands Mb, Md to advance or retreat.

[7] Effects of Substrate Processing Apparatus 100

In a substrate cleaning device 1, the upper holding devices 10A, 10B are located farther upwardly than the lower holding device 20. Further, one hand out of each pair of hands defined in regard to the main robot 300 is located farther upwardly than the other hand.

With such a configuration, when an unprocessed substrate W1 and a substrate W2 on which the cleaning process has been performed are replaced with each other with respect to the substrate cleaning device 1, the transferring operation of transferring the unprocessed substrate W1 is performed by one hand out of each pair of hands with respect to the upper holding devices 10A, 10B, and the receiving operation of receiving the processed substrate W2 is performed by the other hand with respect to the lower holding device 20. Thus, the distance by which the pair of hands is to be moved (to be lifted or lowered) between the position at which the transferring operation is performed by the one hand and the position at which the receiving operation is performed by the other hand is reduced. Further, the substrate processing apparatus 100 has the plurality of substrate cleaning devices 1. Thus, it is possible to clean an upper surface and a lower surface of a substrate W in one substrate cleaning device 1 without turning the substrate W. As a result, efficiency of transfer of a substrate W and efficiency of cleaning of a substrate W in the processing block 120 are improved, so that the throughput of the substrate processing apparatus 100 can be improved.

Further, in a substrate cleaning device 1, upper holding devices 10A, 10B and a lower holding device 20 that are located at different positions are configured to be capable of receiving and transferring a substrate W with respect to the plurality of hands Ma to Md of the main robot 300. Therefore, it is not necessary to transport a substrate W in the substrate cleaning device 1 in order to carry in and carry out the substrate W. Thus, a period of time required for transportation of a substrate W is shortened. Further, in this case, because the configuration (so-called local transport mechanism) for transporting a substrate W in a substrate cleaning device 1 is unnecessary, complication of the configuration of the substrate cleaning device 1 is suppressed.

[8] Other Embodiments (1) While a lower-surface center portion and a lower-surface outer region in a lower surface of a substrate W are cleaned in this order in the substrate cleaning device 1 according to the above-mentioned embodiment, the present invention is not limited to this. In the substrate cleaning device 1, the lower-surface outer region and the lower-surface center portion in the lower surface of the substrate W may be cleaned in this order.

For example, a substrate W that is carried into the substrate cleaning device 1 may be first held by suction by the lower holding device 20, and a lower-surface outer region, an outer peripheral end and an upper surface may be cleaned while being held by suction by the lower holding device 20. Thereafter, the substrate W held by the lower holding device 20 may be transferred to the upper holding devices 10A, 10B, and a lower-surface center portion of the substrate W may be cleaned while being held. A cleaned substrate W may be carried out of the unit casing 2 from the upper holding devices 10A, 10B.

In this manner, in the substrate cleaning device 1, in a case where a substrate W that is carried in is held by the lower holding device 20, and a substrate W held by the upper holding devices 10A, 10B is carried out, the main robot 300 may transport the substrates W in accordance with the below-mentioned operation pattern.

FIG. 21 is a diagram showing one example of the operation pattern of the main robot 300 according to the other embodiment. In the example of FIG. 21, in an initial state, a plurality of unprocessed substrates W1 are respectively placed on the plurality of substrate platforms PASS2, and the plurality of substrate platforms PASS1 are empty. Further, in each of the plurality of substrate cleaning devices 1 in the processing block 120, a processed substrate W2 is held by upper holding devices 10A, 10B.

Here, in the operation pattern of FIG. 21, the hand Ma at the top and the hand Mc located third from the top, out of the four hands Ma to Md of the main robot 300, constitute one set of hands. Further, the hand Mb located second from the top and the hand Md at the bottom constitute the other pair of hands. Therefore, in the present example, the hand Ma functions as a first transport holder of the present invention, and the hand Mc functions as a second transport holder of the present invention. Further, the hand Mb functions as a third transport holder of the present invention, and the hand Md functions as a fourth transport holder of the present invention.

As shown in FIG. 21, the main robot 300 receives two unprocessed substrates W1 from two substrate platforms PASS2 using the hands Mc, Md. Next, the main robot 300 causes the hands Ma, Mc to be opposite to a substrate cleaning device 1A. In this state, the main robot 300 receives a processed substrate W2 from the upper holding devices 10A, 10B by performing the receiving operation using the hand Ma. Further, the main robot 300 transfers an unprocessed substrate W1 to the lower holding device 20 of the substrate cleaning device 1A by performing the transferring operation using the hand Mc.

Next, the main robot 300 causes the hands Mb, Md to be opposite to a substrate cleaning device 1B. In this state, the main robot 300 receives a processed substrate W2 from the upper holding devices 10A, 10B of the substrate cleaning device 1B by performing the receiving operation using the hand Mb. Further, the main robot 300 transfers an unprocessed substrate W1 to the lower holding device 20 of the substrate cleaning device 1B by performing the transferring operation using the hand Md. Next, the main robot 300 transfers two processed substrates W2 to two substrate platforms PASS1 using the hands Ma, Mb.

Alternatively, the main robot 300 may transport a substrate W in accordance with the below-mentioned operation pattern. FIG. 22 is a diagram showing another example of the operation pattern of the main robot 300 according to another embodiment. In the example of FIG. 22, in the initial state, a plurality of unprocessed substrates W1 are respectively placed on the plurality of substrate platforms PASS2, and the plurality of substrate platforms PASS1 are empty. Further, in each of the plurality of substrate cleaning devices 1 in the processing block 120, a processed substrate W2 is held by the upper holding devices 10A, 10B.

Here, in the operation pattern of FIG. 22, the two upper hands Ma, Mb out of the four hands Ma to Md of the main robot 300 constitute one pair of hands. Further, the two lower hands Mc, Md constitute the other pair of hands. Thus, in the present example, the hand Ma functions as a first transport holder of the present invention, and the hand Mb functions as a second transport holder of the present invention. Further, the hand Mc functions as a third transport holder of the present invention, and the hand Md functions as a fourth transport holder of the present invention.

As shown in FIG. 22, the main robot 300 receives two unprocessed substrates W1 from two substrate platforms PASS2 using the hands Mb, Md. Next, the main robot 300 causes the hands Ma, Mb to be opposite to the substrate cleaning device 1A. In this state, the main robot 300 receives a processed substrate W2 from the upper holding devices 10A, 10B by performing the receiving operation using the hand Ma. Further, the main robot 300 transfers an unprocessed substrate W1 to the lower holding device 20 in the substrate cleaning device 1A by performing the transferring operation using the hand Mb.

Next, the main robot 300 causes the hands Mc, Md to be opposite to the substrate cleaning device 1B. In this state, the main robot 300 receives a processed substrate W2 from the upper holding devices 10A, 10B of the substrate cleaning device 1B by performing the receiving operation using the hand Mc. Further, the main robot 300 transfers an unprocessed substrate W1 to the lower holding device 20 of the substrate cleaning device 1B by performing the transferring operation using the hand Md. Next, the main robot 300 transfers two processed substrates W2 using the hands Ma, Mc.

(2) While the plurality of substrate cleaning devices 1 are provided as first and second substrate processors for performing a predetermined process on substrates W in the processing block 120 in the substrate processing apparatus 100 according to the above-mentioned embodiment, the present invention is not limited to this.

In the substrate processing apparatus 100, a processor for performing a process other than the cleaning process may be provided as first and second substrate processors for performing a predetermined process on substrates W. Such a processor includes a thermal processing device that can perform a heating process and a cooling process on a substrate W.

In the thermal processing device, a hot plate that can heat a substrate W is arranged at a bottom surface portion in a casing, and a cooling plate that cools a substrate W is arranged in the ceiling of the casing, for example. Further, a substrate lifting-lowering device that moves a substrate W between the hot plate and the cooling plate is provided. Further, the substrate lifting-lowering device is configured to be capable of receiving a substrate W to be carried in in a lower portion of the casing (a position in the vicinity of the hot plate) and is configured to be capable of transferring a substrate W to be carried out in an upper portion of the casing (a position in the vicinity of the cooling plate).

(3) While the indexer robot 200 according to the above-mentioned embodiment has the four hands Ia, Ib, Ic, Id, the indexer robot 200 may have a plurality of hands such as two, three, five, six hands or the like.

Further, while the main robot 300 according to the above-mentioned embodiment has the four hands Ma, Mb, Mc, Md similarly to the indexer robot 200, the main robot 300 may only have two hands Ma, Mb. Alternatively, the main robot 300 may have five hands or more.

With the configuration of FIG. 1, in a case where the main robot 300 has the three hands Ma to Mc, even when a substrate W is held by two hands out of three hands Ma, Mb, Mc, a remaining hand is empty. Therefore, even in a case where the main robot 300 including only the three hands Ma to Mc is used, a substrate W can be basically transported in accordance with the same operation pattern as the examples of FIGS. 19 to 22.

[9] Correspondences Between Constituent Elements in Claims and Parts in Preferred Embodiments In the following paragraphs, non-limiting examples of correspondences between various elements recited in the claims below and those described above with respect to various preferred embodiments of the present disclosure are explained.

In the above-mentioned embodiment, the substrate W1 is an example of first and third substrates, the upper holding devices 10A, 10B are examples of first and third substrate holders, the substrate W2 is an example of second and fourth substrates, the lower holding device 20 is an example of second and fourth substrate holders, the substrate cleaning device 1 is an example of first and second substrate processors, the hand Ma is an example of a first transport holder, the hand Md and one of the hand Mb and the hand Mc are an example of a second transport holder, the controller 111 is an example of a transport controller, and the substrate processing apparatus 100 is an example of a substrate processing apparatus.

Further, the substrate platform PASS2 is an example of a first substrate supporter, the hand Mb or the hand Mc is an example of a third transport holder, the hand Md is an example of a fourth transport holder, and the lower-surface cleaning device 50 is an example of a cleaner.

As each of constituent elements recited in the claims, various other elements having configurations or functions described in the claims can be also used.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

We claim:

1. A substrate processing apparatus comprising:
a first substrate processor that includes a first substrate holder configured to be capable of holding a first substrate at a first height position and a second substrate holder configured to be capable of holding a second substrate at a second height position lower than the first height position;
a substrate transporter including a first transport holder configured to be capable of holding the first substrate and a second transport holder configured to be capable of holding the second substrate at a position farther downward than the first transport holder;
a transport controller that includes a central processing unit and a memory configured to perform first control for controlling the substrate transporter, such that the first substrate is transferred to or received from the first substrate holder by the first transport holder and the second substrate is received from or transferred to the second substrate holder by the second transport holder; and
a receiving-transferring device that moves either one of the first substrate and the second substrate in an up-and-down direction between the first height position of the first substrate held by the first substrate holder and the second height position of the second substrate held by the second substrate holder,
the receiving-transferring device including
a plurality of support pins that hold the one substrate in a horizontal attitude, and
a lifting-lowering driver that moves the plurality of pins in an up-and-down direction to move the one substrate between the first height position and the second height position while maintaining the one substrate in the horizontal attitude,
wherein the first substrate holder includes:
a pair of chucks movably provided to be closer to each other or be farther away from each other in a common horizontal plane, and
a chuck driver that moves the pair of chucks, so that the pair of chucks is changed between a state where the pair of chucks non-rotatably holds the substrate by abutting against an outer peripheral end of the substrate and a state where the pair of chucks does not hold the substrate by being spaced apart from the outer peripheral end of the substrate.

2. The substrate processing apparatus according to claim 1, further comprising a first substrate supporter configured to be capable of supporting the first substrate and supporting a third substrate below the first substrate, wherein the substrate transporter further includes a third transport holder configured to be capable of holding the third substrate at a position farther downward than the first transport holder, and the transport controller performs second control for controlling the substrate transporter, such that the first substrate supported by the first substrate supporter is received by the first transport holder and the third substrate supported by the first substrate supporter is received by the third transport holder with the first substrate and the third substrate supported by the first substrate supporter, before the first control is performed.

3. The substrate processing apparatus according to claim 2, further comprising a second substrate supporter configured to be capable of supporting the second substrate, wherein the transport controller performs third control for controlling the substrate transporter such that the second substrate that has been received by the second transport holder is transferred to the second substrate supporter, after the first control is performed such that the second transport holder receives the second substrate.

4. The substrate processing apparatus according to claim 1, further comprising a second substrate processor including a third substrate holder configured to be capable of holding a third substrate at a third height position and a fourth substrate holder configured to be capable of holding a fourth substrate at a fourth height position lower than the third height position, wherein the substrate transporter further includes a third transport holder configured to be capable of holding the third substrate at a position farther downward than the first transport holder and a fourth transport holder configured to be capable of holding the fourth substrate at a position farther downward than the third transport holder, and the transport controller performs fourth control for controlling the substrate transporter, such that the third substrate is transferred to or received from the third substrate holder by the third transport holder and the fourth substrate is received from or transferred to the fourth substrate holder by the fourth transport holder.

5. The substrate processing apparatus according to claim 4, further comprising a first substrate supporter configured to be capable of supporting the first substrate and supporting the third substrate below the first substrate, wherein the transport controller performs fifth control for controlling the substrate transporter, such that the first substrate supported by the first substrate supporter is received by the first transport holder and the third substrate supported by the first substrate supporter is received by the third transport holder with the first substrate and the third substrate supported by the first substrate supporter, before the first control and the fourth control are performed.

6. The substrate processing apparatus according to claim 5, further comprising a second substrate supporter configured to be capable of supporting the second substrate and configured to be capable of supporting the fourth substrate below the second substrate, wherein the transport controller performs sixth control for controlling the substrate transporter such that the second substrate that has been received by the second transport holder is transferred to the second substrate supporter, after the first control is performed such that the second transport holder receives the second substrate, and performs seventh control for controlling the substrate transporter such that the fourth substrate that has been received by the fourth transport holder is transferred to the second substrate supporter, after the fourth control is performed such that the fourth transport holder receives the fourth substrate.

7. The substrate processing apparatus according to claim 1, wherein a distance between the first height position and the second height position is equal to or substantially equal to a distance between a portion holding the first substrate of the first transport holder and a portion holding the second substrate of the second transport holder in an up-and-down direction.

8. The substrate processing apparatus according to claim 1, wherein the first substrate holder is configured to be capable of holding the first substrate by abutting against a plurality of portions of an outer peripheral end of the first substrate, the second substrate holder is configured to be capable of holding the second substrate by sucking a lower-surface center portion of the second substrate, and the first substrate processor further includes a cleaner configured to be capable of cleaning the lower-surface center portion of the first substrate held by the first substrate holder and configured to be capable of cleaning a lower-surface outer region surrounding the lower-surface center portion of the second substrate held by the second substrate holder.

9. The substrate processing apparatus according to claim 1, wherein the first control includes controlling the substrate transporter such that the first substrate is directly transferred to or directly received from the first substrate holder by the first transport holder.

10. A substrate processing method including:

performing a first operation of transferring a first substrate to or receiving the first substrate from a first substrate holder that is included in a first substrate processor and configured to be capable of holding the first substrate at a first height position, using a first transport holder that is included in a substrate transporter and configured to be capable of holding the first substrate;

performing a second operation of receiving a second substrate from or transferring the second substrate to a second substrate holder that is included in the first substrate processor and configured to be capable of holding the second substrate at a second height position lower than the first height position, using a second transport holder that is included in the substrate transporter and configured to be capable of holding the second substrate at a position farther downward than the first transport holder; and moving either one of the first substrate and the second substrate in an up-and-down direction between the first height position of the first substrate held by the first substrate holder and the second height position of the second substrate held by the second substrate holder, the moving the one substrate in an up-and-down direction including holding the one substrate in a horizontal attitude by a plurality of support pins, and moving the plurality of support pins in an up-and-down direction to move the one substrate between the first height position and the second height position while maintaining the one substrate in the horizontal attitude, wherein the first substrate holder includes:
a pair of chucks movably provided to be closer to each other or be farther away from each other in a common horizontal plane, and
a chuck driver that moves the pair of chucks, so that the pair of chucks is changed between a state where the pair of chucks non-rotatably holds the substrate by abutting against an outer peripheral end of the substrate and a state where the pair of chucks does not hold the substrate by being spaced apart from the outer peripheral end of the substrate.

11. The substrate processing method according to claim 10, further including receiving the first substrate supported by the first substrate supporter using the first transport holder and receiving a third substrate supported by the first substrate supporter using a third transport holder configured to be capable of holding the third substrate at a position farther downward than the first transport holder with the first substrate and the third substrate supported by the first substrate supporter configured to be capable of supporting the first substrate and supporting the third substrate below the first substrate, before the first and second operations are performed.

12. The substrate processing method according to claim 10, further including transferring the second substrate that has been received by the second transport holder to a second substrate supporter configured to be capable of supporting the second substrate, after the first and second operations are performed such that the second transport holder receives the second substrate.

13. The substrate processing method according to claim 10, further including:
performing a third operation of transferring a third substrate to or receiving the third substrate from a third substrate holder that is included in a second substrate processor and configured to be capable of holding the third substrate at a third height position using a third transport holder that is included in the substrate transporter and configured to be capable of holding the third substrate at a position farther downward than the first transport holder; and
performing a fourth operation of receiving a fourth substrate from or transferring the fourth substrate to a fourth substrate holder that is included in the second substrate processor and configured to be capable of holding the fourth substrate at a fourth height position lower than the third height position using a fourth transport holder that is included in the substrate transporter and configured to be capable of holding the fourth substrate at a position farther downward than the third transport holder.

14. The substrate processing method according to claim 13, further including receiving the first substrate supported by the first substrate supporter using the first transport holder and receiving the third substrate supported by the first substrate supporter using the third transport holder with the first substrate and the third substrate supported by a first substrate supporter configured to be capable of supporting the first substrate and supporting the third substrate below the first substrate, before the first to fourth operations are performed.

15. The substrate processing method according to claim 14, further including:
transferring the second substrate that has been received by the second transport holder to a second substrate supporter configured to be capable of supporting the second substrate and configured to be capable of supporting the fourth substrate below the second substrate, after the first and second operations are performed such that the second transport holder receives the second substrate; and
transferring the fourth substrate that has been received by the fourth transport holder to the second substrate supporter, after the third and fourth operations are performed such the fourth transport holder receives the fourth substrate.

16. The substrate processing method according to claim 10, wherein the performing a first operation includes directly transferring the first substrate to or directly receiving the first substrate from the first substrate holder by the first transport holder.

17. A substrate processing apparatus comprising:
a first substrate processor that includes a first substrate holder configured to be capable of holding a first substrate at a first height position and a second substrate holder configured to be capable of holding a second substrate at a second height position lower than the first height position;
a substrate transporter including a first transport holder configured to be capable of holding the first substrate and a second transport holder configured to be capable of holding the second substrate at a position farther downward than the first transport holder; and
a transport controller that includes a central processing unit and a memory configured to perform first control for controlling the substrate transporter, such that the first substrate is transferred to or received from the first substrate holder by the first transport holder and the second substrate is received from or transferred to the second substrate holder by the second transport holder, wherein the first substrate processor performs predetermined first processing on the first substrate held by the first substrate holder and performs second processing that is different from the first processing on the second substrate held by the second substrate holder,
the first substrate holder includes:
a pair of chucks movably provided to be closer to each other or be farther away from each other in a common horizontal plane, and
a chuck driver that moves the pair of chucks, so that the pair of chucks is changed between a state where the pair of chucks non-rotatably holds the substrate by abutting against an outer peripheral end of the substrate and a state where the pair of chucks does not hold the substrate by being spaced apart from the outer peripheral end of the substrate.

18. The substrate processing apparatus according to claim 17, wherein the first control includes controlling the substrate transporter such that the first substrate is directly transferred to or directly received from the first substrate holder by the first transport holder.

19. A substrate processing method including:
performing a first operation of transferring a first substrate to or receiving the first substrate from a first substrate holder that is included in a first substrate processor and configured to be capable of holding the first substrate at a first height position, using a first transport holder that is included in a substrate transporter and configured to be capable of holding the first substrate;
performing a second operation of receiving a second substrate from or transferring the second substrate to a second substrate holder that is included in the first substrate processor and configured to be capable of holding the second substrate at a second height position lower than the first height position, using a second transport holder that is included in the substrate transporter and configured to be capable of holding the second substrate at a position farther downward than the first transport holder; and performing first processing on the first substrate held by the first substrate holder and performing second processing that is different from the first processing on the second substrate held by the second substrate holder in the first substrate processor, wherein the first substrate holder includes:

a pair of chucks movably provided to be closer to each other or be farther away from each other in a common horizontal plane, and a chuck driver that moves the pair of chucks, so that the pair of chucks is changed between a state where the pair of chucks non-rotatably holds the substrate by abutting against an outer peripheral end of the substrate and a state where the pair of chucks does not hold the substrate by being spaced apart from the outer peripheral end of the substrate.

20. The substrate processing method according to claim 19, wherein the performing a first operation includes directly transferring the first substrate to or directly receiving the first substrate from the first substrate holder by the first transport holder.

* * * * *